(12) United States Patent
Young et al.

(10) Patent No.: US 11,322,505 B2
(45) Date of Patent: May 3, 2022

(54) FERROELECTRIC RANDOM ACCESS MEMORY DEVICES AND METHODS

(71) Applicant: Taiwan Semiconductor Manufacturing Co., Ltd., Hsinchu (TW)

(72) Inventors: Bo-Feng Young, Taipei (TW); Sai-Hooi Yeong, Zhubei (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/916,363

(22) Filed: Jun. 30, 2020

(65) Prior Publication Data

US 2021/0408022 A1    Dec. 30, 2021

(51) Int. Cl.
*H01L 27/15*         (2006.01)
*H01L 27/11514*      (2017.01)
*H01L 29/66*         (2006.01)
*H01L 29/06*         (2006.01)
*H01L 27/092*        (2006.01)

(52) U.S. Cl.
CPC .... *H01L 27/11514* (2013.01); *H01L 27/0924* (2013.01); *H01L 29/0669* (2013.01); *H01L 29/66795* (2013.01)

(58) Field of Classification Search
CPC .......... H01L 27/11514; H01L 27/0924; H01L 29/66795; H01L 29/0669
USPC ...................................................... 257/295
See application file for complete search history.

(56) References Cited

U.S. PATENT DOCUMENTS

| | | | |
|---|---|---|---|
| 6,140,672 A * | 10/2000 | Arita ................. | H01L 21/76895 257/295 |
| 9,190,135 B2 * | 11/2015 | Appenzeller ....... | H01L 27/1159 |
| 9,209,247 B2 | 12/2015 | Colinge et al. | |
| 9,224,833 B2 | 12/2015 | Chen et al. | |
| 9,251,888 B1 | 2/2016 | Liaw | |
| 9,362,355 B1 * | 6/2016 | Cheng ............... | H01L 29/66439 |
| 9,871,140 B1 * | 1/2018 | Balakrishnan ........ | H01L 27/092 |
| 10,128,327 B2 * | 11/2018 | Zhang ............... | H01L 29/40111 |
| 10,170,520 B1 * | 1/2019 | Frougier ............. | H01L 29/7851 |
| 10,374,086 B2 | 8/2019 | Hu | |
| 10,396,145 B2 * | 8/2019 | Balakrishnan .......... | H01L 28/65 |
| 10,559,656 B2 * | 2/2020 | Bourjot ............. | H01L 29/42392 |
| 10,720,431 B1 * | 7/2020 | Cheng ................. | H01L 21/3086 |
| 11,121,215 B2 * | 9/2021 | Li ...................... | H01L 29/66553 |
| 2006/0002170 A1 * | 1/2006 | Kumura .................. | H01L 28/65 257/295 |

(Continued)

FOREIGN PATENT DOCUMENTS

| | | |
|---|---|---|
| KR | 20190130460 A | 11/2019 |
| KR | 20200007711 A | 1/2020 |
| TW | 201719895 A | 6/2017 |

*Primary Examiner* — Mohammad M Hoque
(74) *Attorney, Agent, or Firm* — Slater Matsil, LLP

(57) ABSTRACT

A method of forming a semiconductor device includes: forming a first fin protruding above a substrate; forming first source/drain regions over the first fin; forming a first plurality of nanostructures over the first fin between the first source/drain regions; forming a first gate structure around the first plurality of nanostructures; and forming a first ferroelectric capacitor over and electrically coupled to the first gate structure.

20 Claims, 17 Drawing Sheets

(56) References Cited

U.S. PATENT DOCUMENTS

| | | | |
|---|---|---|---|
| 2006/0014307 A1* | 1/2006 | Kweon | H01L 28/75 438/3 |
| 2009/0134465 A1* | 5/2009 | Shimizu | H01L 29/40114 257/368 |
| 2011/0012085 A1* | 1/2011 | Deligianni | H01L 29/0676 257/9 |
| 2013/0193400 A1* | 8/2013 | Sandhu | H01L 27/2463 257/5 |
| 2013/0341704 A1* | 12/2013 | Rachmady | H01L 29/1033 257/327 |
| 2014/0106523 A1* | 4/2014 | Koldiaev | H01L 27/088 438/212 |
| 2015/0048442 A1 | 2/2015 | Colinge et al. | |
| 2015/0303270 A1 | 10/2015 | Liaw | |
| 2015/0370947 A1* | 12/2015 | Moroz | B82Y 10/00 716/119 |
| 2017/0263706 A1* | 9/2017 | Gardner | H01L 29/66795 |
| 2017/0358665 A1* | 12/2017 | Song | H01L 29/495 |
| 2017/0365661 A1* | 12/2017 | Doris | H01L 29/66545 |
| 2017/0373163 A1* | 12/2017 | Vellianitis | H01L 29/78696 |
| 2018/0006113 A1* | 1/2018 | Cheng | H01L 21/823481 |
| 2018/0076334 A1* | 3/2018 | Ando | H01L 29/40111 |
| 2018/0175167 A1* | 6/2018 | Reboh | H01L 21/823864 |
| 2018/0226417 A1* | 8/2018 | Ando | H01L 29/0649 |
| 2019/0130956 A1* | 5/2019 | Muller | H01L 29/0673 |
| 2019/0148515 A1* | 5/2019 | Cheng | H01L 29/66553 257/347 |
| 2019/0237360 A1* | 8/2019 | Reznicek | H01L 29/7853 |
| 2019/0280104 A1* | 9/2019 | Ma | H01L 29/785 |
| 2019/0318775 A1 | 10/2019 | Rakshit et al. | |
| 2019/0378915 A1* | 12/2019 | Frougier | H01L 21/02603 |
| 2019/0386011 A1* | 12/2019 | Weckx | H01L 29/42392 |
| 2020/0013870 A1 | 1/2020 | Ha et al. | |
| 2020/0020689 A1 | 1/2020 | Ohtou et al. | |
| 2020/0027791 A1* | 1/2020 | Loubet | H01L 29/41725 |
| 2020/0044061 A1* | 2/2020 | Cheng | H01L 29/66439 |
| 2020/0083041 A1 | 3/2020 | Lee et al. | |
| 2020/0091162 A1* | 3/2020 | Morris | G11C 11/2257 |
| 2020/0105889 A1 | 4/2020 | Liaw | |
| 2020/0168722 A1 | 5/2020 | Hung et al. | |
| 2020/0168742 A1 | 5/2020 | Wang et al. | |
| 2020/0235110 A1* | 7/2020 | Morris | G11C 11/221 |
| 2021/0082686 A1* | 3/2021 | Chiang | H01L 29/0847 |
| 2021/0082914 A1* | 3/2021 | Lee | H01L 29/785 |
| 2021/0125983 A1* | 4/2021 | Choi | H01L 27/0886 |
| 2021/0193836 A1* | 6/2021 | Guha | H01L 29/0669 |
| 2021/0210598 A1* | 7/2021 | Cheng | H01L 29/42392 |
| 2021/0233910 A1* | 7/2021 | Yeh | H01L 29/0665 |
| 2021/0257452 A1* | 8/2021 | Trivedi | H01L 29/66439 |
| 2021/0280683 A1* | 9/2021 | Trivedi | H01L 29/66795 |

\* cited by examiner

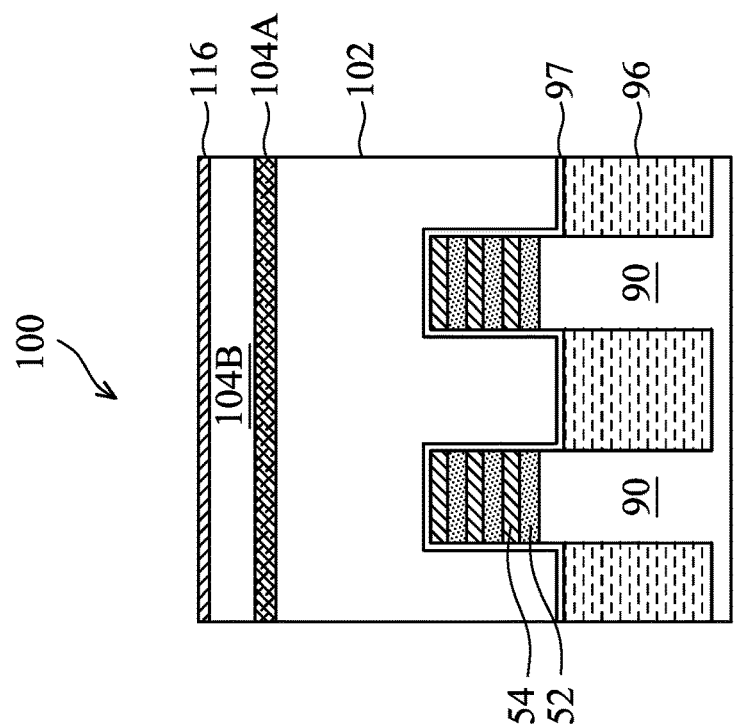
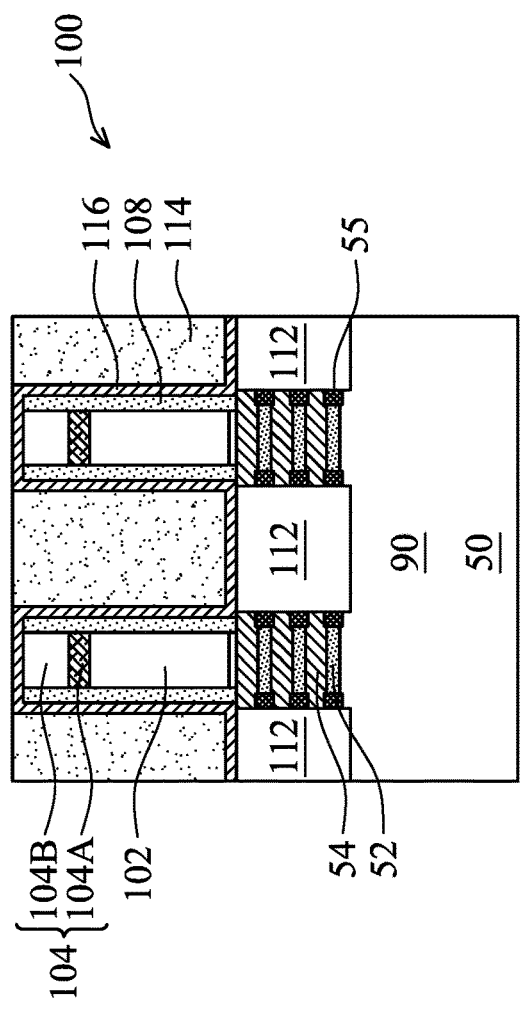
Figure 7A
Figure 7B

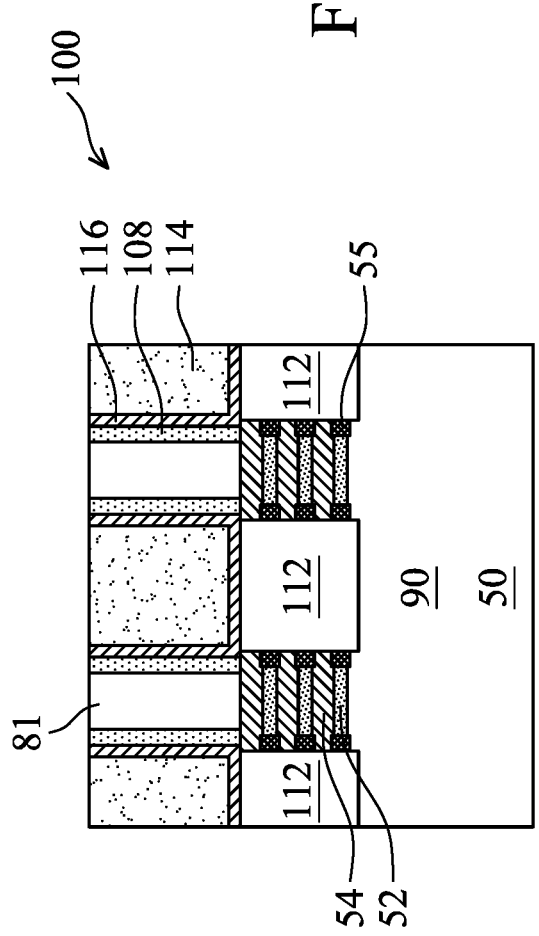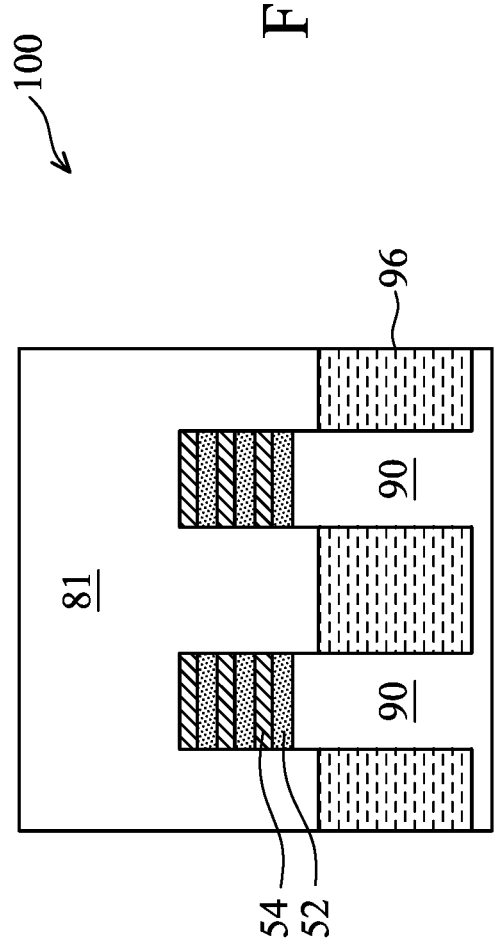
Figure 9A
Figure 9B

FERROELECTRIC RANDOM ACCESS MEMORY DEVICES AND METHODS

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin field-effect transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin. Gate-all-around field-effect transistor (GAA FET) devices are also becoming commonly used. A GAA FET device has nanostructures (e.g., nanowires, nanosheets) formed over a semiconductor fin. The nanostructures function as the channel region of the device, and gate electrode are formed around the nanostructures to control the GAA FET device. Compared to the FinFET device, the GAA FET device can further enhance gate controllability over the respective channel region, which in turn provides various advantages over the FinFET devices such as, for example, a lower leakage current, a higher ratio of turn-on current to turn-off current, etc.

Ferroelectric random access memory (FeRAM, or FRAM) is a candidate for next generation non-volatile memory, due to its fast write/read speed and small size. In the one-transistor one-capacitor (1T-1C) FeRAM structure, the FeRAM memory cell includes a transistor (e.g., a GAA FET) and a ferroelectric capacitor electrically coupled to the transistor. The existing FeRAM structure has limited tuning capability to tune the properties of the FeRAM device formed. There is a need in the art for FeRAM structures that could achieve highly flexible tuning capability and high integration density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, and 14B are cross-sectional views of an FeRAM device at various stages of manufacturing, in accordance with an embodiment.

DETAILED DESCRIPTION

Figure 1:
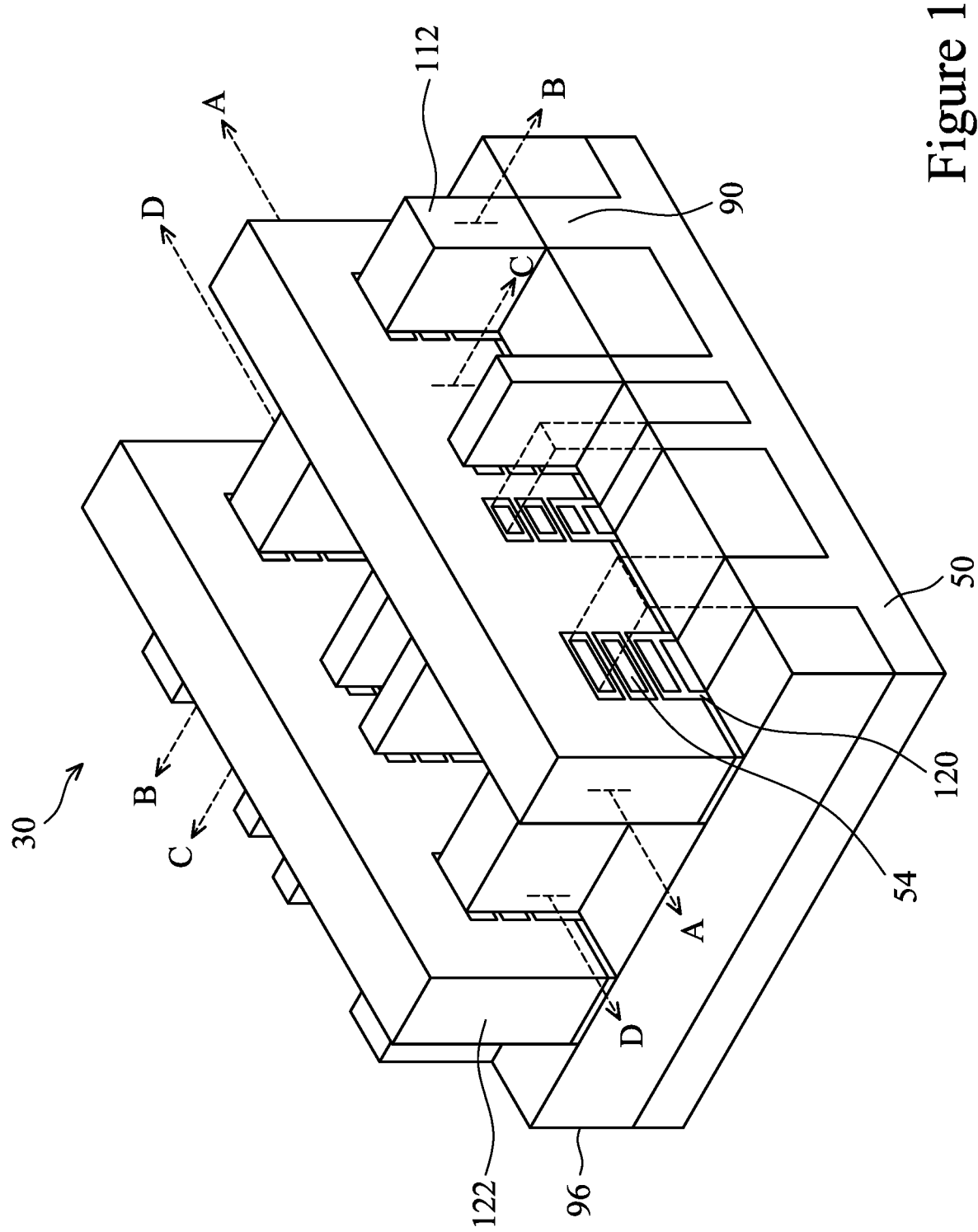
FIG. 1 illustrates an example of a gate-all-around field-effect transistor (GAA FET) device in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same numeral in different figures refers to the same or similar component formed by a same or similar method using a same or similar material(s).

In accordance with some embodiments, a 1T-1C FeRAM device is formed by forming a layer stack over a fin, where the layer stack includes alternating layers of a first semiconductor material and a second semiconductor material. A dummy gate structure is formed over the layer stack and over the fin, gate spacers are formed along sidewalls of the dummy gate structure, and source/drain regions are formed in the layer stack on opposing sides of the dummy gate structure. The dummy gate structure is then removed to expose portions of the layer stack under the dummy gate structure. Next, at least a top layer of the second semiconductor material is removed from the layer stack. Next, the first semiconductor material is removed by a selective etching process, and the remaining layers of the second semiconductor material form a plurality of nanostructures (e.g., nanosheets or nanowires). A metal gate structure is then formed over and around the nanostructures, and a ferroelectric capacitor is formed over and electrically coupled to the metal gate structure to form a 1T-1C FeRAM memory cell. The disclosed embodiments provides increased flexibility in tuning the area of the channel regions of the GAA FET in the 1T-1C memory cell, thereby allowing for a large difference (e.g., a large ratio) between the area of the channel regions of the GAA FET and the area of the ferroelectric layer in the ferroelectric capacitor, which advantageously increases the threshold voltage shift for the FeRAM memory cell formed and allows for easier read operation of the FeRAM device with more tolerance for device variations.

FIG. 1 illustrates an example of a gate-all-around field-effect transistor (GAA FET) device 30 in a three-dimensional view, in accordance with some embodiments. The GAA FET device 30 comprises a substrate 50 and a plurality of fin structures over the substrate 50, wherein each fin structure includes a semiconductor fin 90 (also referred to as a fin) protruding above the substrate 50, and nanostructures 54 (e.g., nanosheets or nanowires) over the fin 90. Gate electrodes 122 (e.g., metal gates) are disposed over the fin structures, and source/drain regions 112 are formed on opposing sides of the gate electrodes 122. Isolation regions 96 are formed on opposing sides of the fins 90. A gate dielectric layer 120 is formed around the nanostructures 54. Gate electrodes 122 are over and around the gate dielectric layer 120. The GAA FET device 30 may also be referred to as a FinFET device with nanostructures, or a nanostructure device for short. Depending on the aspect ratio of the nanostructures 54, the nanostructures 54 may also be referred to as nanosheets or nanowires. Therefore, the GAA FET device 30 may also be referred to as a nanosheet device, a nanowire device, or a gate-all-around (GAA) device.

FIG. 1 further illustrates reference cross-sections that are used in later figures. Cross-section A-A is along a longitudinal axis of a gate electrode 122 and in a direction, for example, perpendicular to the direction of current flow between the source/drain regions 112 of the GAA FET device 30. Cross-section B-B is perpendicular to cross-section A-A and is along a longitudinal axis of a fin and in a direction of, for example, a current flow between the source/drain regions 112 of the GAA FET device. Cross-section C-C is parallel to cross-section B-B and between two neighboring fins. Cross-section D-D is parallel to cross-section A-A and extends through source/drain regions 112 of the GAA FET device. Subsequent figures may refer to these reference cross-sections for clarity.

FIGS. 2, 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, and 14B are cross-sectional views of an FeRAM device 100 at various stages of manufacturing, in accordance with an embodiment. As will be discussed in details hereinafter, the FeRAM device 100 includes a nanostructure device similar to that of FIG. 1, and further includes ferroelectric capacitors over and electrically coupled to the nanostructure device to form a ferroelectric random access (FRAM or FeRAM) device.

Figure 2:
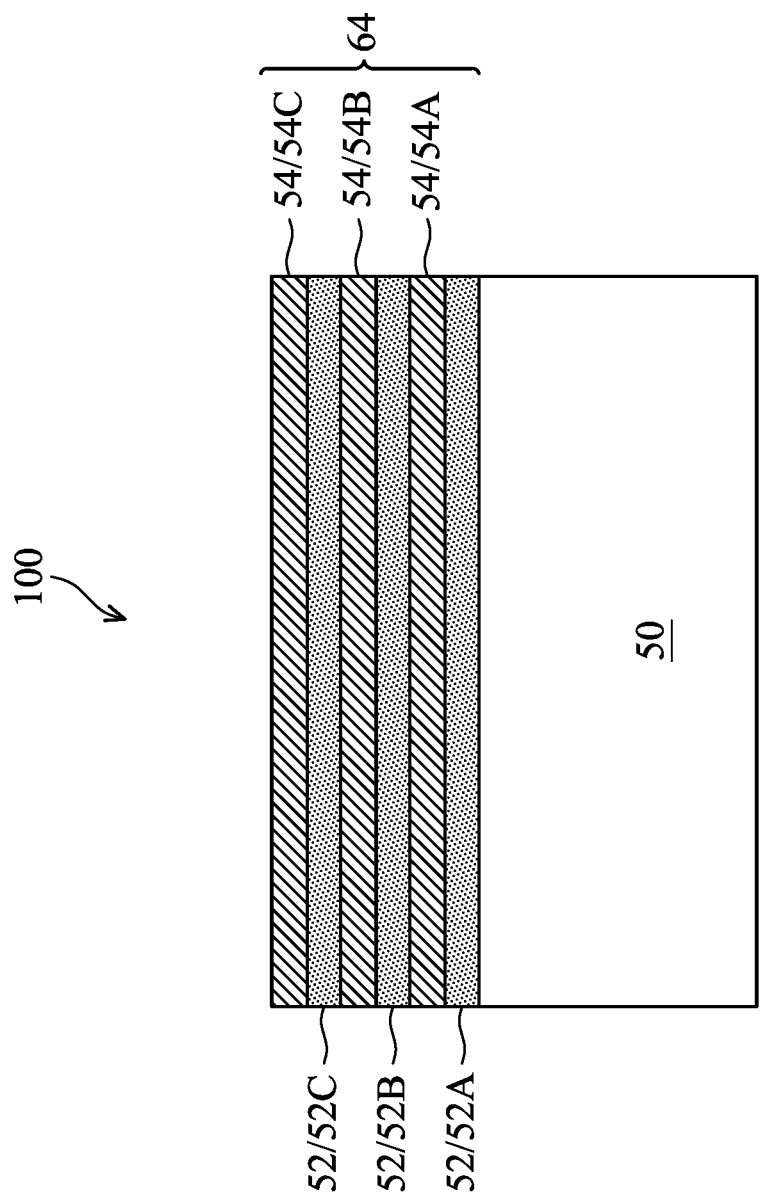

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A multi-layer stack 64 is formed on the substrate 50. The multi-layer stack 64 includes alternating layers of a first semiconductor material 52 and a second semiconductor material 54. In FIG. 2, layers formed by the first semiconductor material 52 are labeled as 52A, 52B, and 52C, and layers formed by the second semiconductor material 54 are labeled as 54A, 54B, and 54C. The number of layers formed by the first and the second semiconductor materials illustrated in FIG. 2 are merely non-limiting examples. Other numbers of layers are also possible and are fully intended to be included within the scope of the present disclosure.

In some embodiments, the first semiconductor material 52 is an epitaxial material appropriate for forming channel regions of P-type FETs, such as silicon germanium ($Si_xGe_{1-x}$, where x can be in the range of 0 to 1), and the second semiconductor material 54 is an epitaxial material appropriate for forming channel regions of N-type FETs, such as silicon. In other embodiments, the first semiconductor material 52 is an epitaxial material appropriate for forming channel regions of N-type FETs, and the second semiconductor material 54 is an epitaxial material appropriate for forming channel regions of P-type FETs. The discussion herein uses the example that the first semiconductor material 52 and the second semiconductor material 54 are epitaxial materials appropriate for forming channel regions of P-type FETs and N-type FETs, respectively. One of ordinary skill, after reading the disclosure herein, will be able to readily apply the principle disclosed herein for embodiments where the first semiconductor material 52 and the second semiconductor material 54 are epitaxial materials appropriate for forming channel regions of N-type FETs and P-type FETs, respectively.

The multi-layer stacks 64 (which may also be referred to as an epitaxial material stack) will be patterned to form channel regions of a GAA FET in subsequent processing. In particular, the multi-layer stacks 64 will be patterned to form nanostructures (e.g., nanosheets or nanowires), with the channel regions of the resulting GAA FET including multiple nanosheets or nanowires.

The multi-layer stacks 64 may be formed by an epitaxial growth process, which may be performed in a growth chamber. During the epitaxial growth process, the growth chamber is cyclically exposed to a first set of precursors for selectively growing the first semiconductor material 52, and then exposed to a second set of precursors for selectively growing the second semiconductor material 54, in some embodiments. The first set of precursors includes precursors for the first semiconductor material (e.g., silicon germanium), and the second set of precursors includes precursors for the second semiconductor material (e.g., silicon). In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing the first semiconductor material 52; and (2) disabling the flow of the germanium precursor to the growth chamber when growing the second semiconductor material 54. The cyclical exposure may be repeated until a target number of layers are formed.

FIGS. 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, and 14B are cross-sectional views of the FeRAM device 100 at various subsequent stages of manufacturing, in accordance with an embodiment. FIGS. 3A, 4A, 5A, 6A, 7A, 8A, 9A, 10A, 11A, 12A, 13A, and 14A are cross-sectional views along cross-section B-B in FIG. 1. FIGS. 3B, 4B, 5B, 6B, 7B, 8B, 9B, 10B, 11B, 12B, 13B, and 14B are cross-sectional views along cross-section A-A in FIG. 1. Although two fins and two gate structures are illustrated in the figures as a non-limiting example, it should be appreciated that other numbers of fins and other numbers of gate structures may also be formed.

Figure 3B:
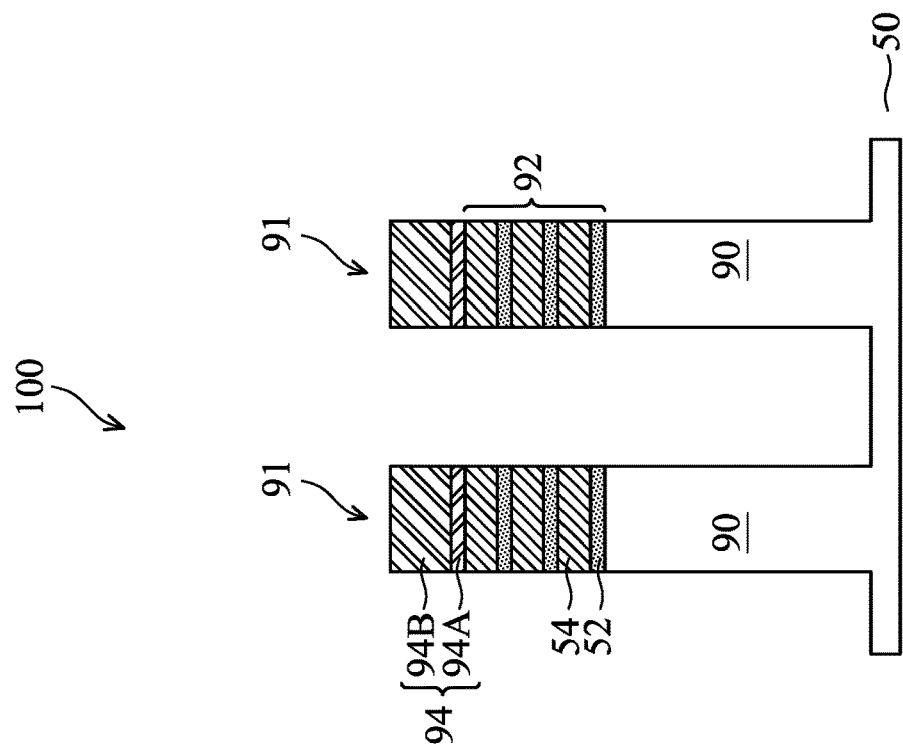
Figure 3A:
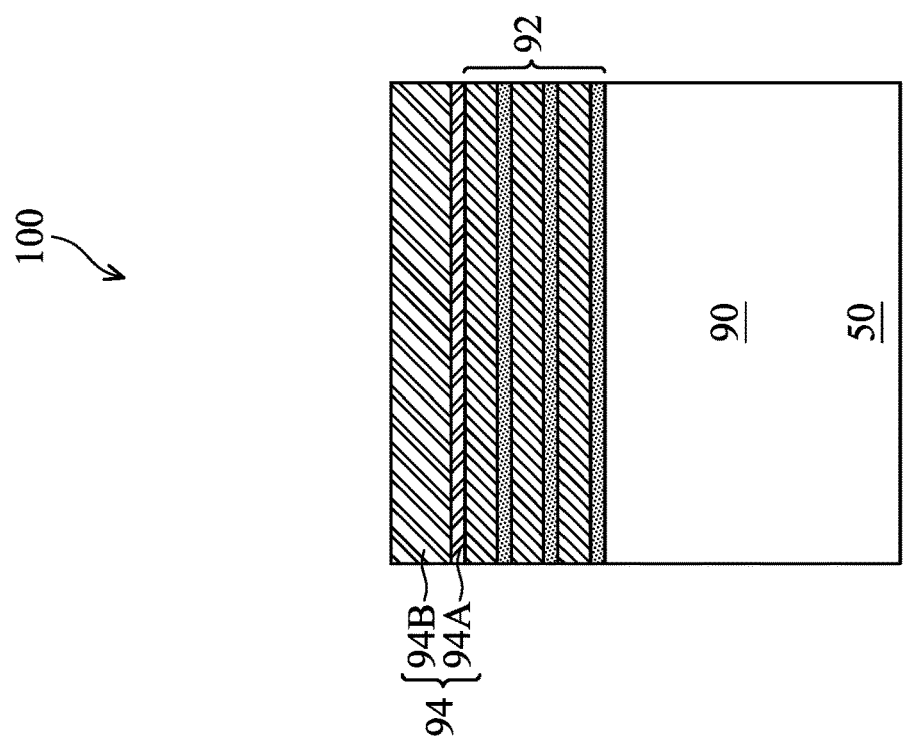

In FIGS. 3A and 3B, fin structures 91 are formed protruding above the substrate 50. Each of the fin structures 91 includes a semiconductor fin 90 and a layer stack 92 overlying the semiconductor fin 90. The layer stack 92 and the semiconductor fin 90 may be formed by etching trenches in the multi-layer stack 64 and the substrate 50, respectively. In some embodiments, a same anisotropic etching process is used to form the layer stack 92 and the semiconductor fin 90.

The fin structures 91 may be patterned by any suitable method. For example, the fin structure 91 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fin structure 91.

In some embodiments, the remaining spacers are used to pattern a mask 94, which is then used to pattern the fin structure 91. The mask 94 may be a single layer mask, or may be a multilayer mask such as a multilayer mask that includes a first mask layer 94A and a second mask layer 94B. The first mask layer 94A and second mask layer 94B may each be formed from a dielectric material such as silicon oxide, silicon nitride, a combination thereof, or the like, and may be deposited or thermally grown according to suitable techniques. The first mask layer 94A and second mask layer 94B are different materials having a high etching selectivity. For example, the first mask layer 94A may be silicon oxide, and the second mask layer 94B may be silicon nitride. The mask 94 may be formed by patterning the first mask layer 94A and the second mask layer 94B using any acceptable etching process. The mask 94 may then be used as an etching mask to etch the substrate 50 and the multi-layer stack 64. The etching may be any acceptable etch process, such as a reactive ion etch (RIE), neutral beam etch (NBE), the like, or a combination thereof. The etching is an anisotropic etching process, in some embodiments. After the etching process, the patterned multi-layer stack 64 forms the layer stacks 92, and the patterned substrate 50 forms the semiconductor fins 90, as illustrated in FIGS. 3A and 3B. Therefore, in the illustrated embodiment, the layer stack 92 includes alternating layers of the first semiconductor material 52 and the second semiconductor material 54, and the semiconductor fin 90 is formed of a same material (e.g., silicon) as the substrate 50.

Figure 4B:
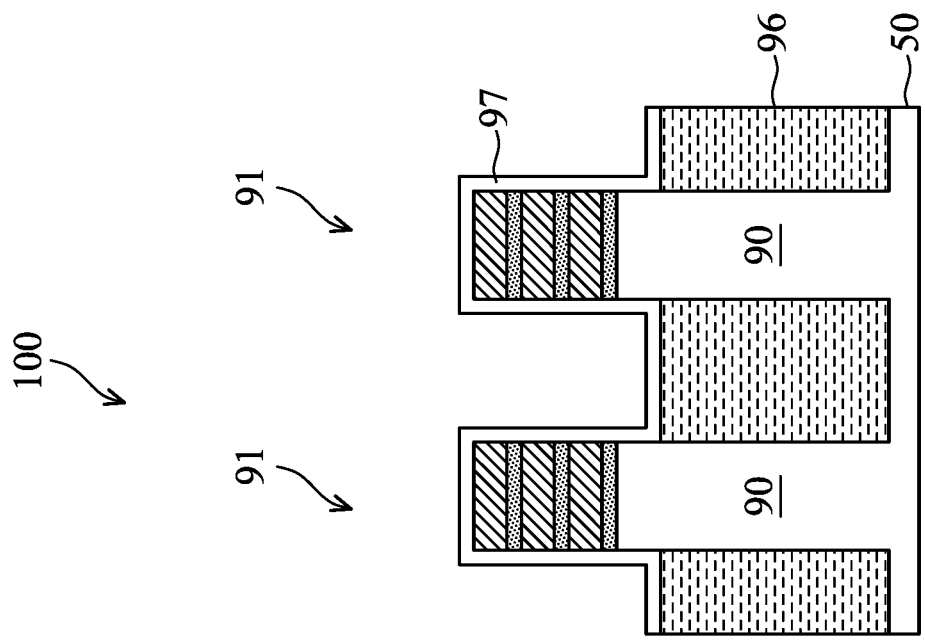
Figure 4A:
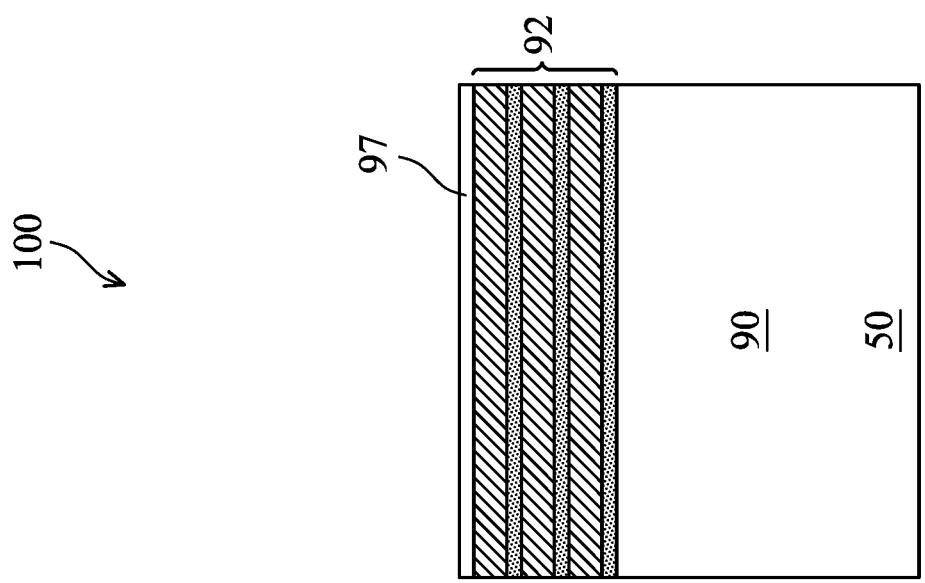

Next, in FIGS. 4A and 4B, Shallow Trench Isolation (STI) regions 96 are formed over the substrate 50 and on opposing sides of the fins 90. As an example to form the STI regions 96, an insulation material may be formed over the substrate 50. The insulation material may be an oxide (e.g., silicon oxide), a nitride (e.g., silicon nitride), the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by an FCVD process. An anneal process may be performed after the insulation material is formed.

In some embodiments, the insulation material is formed such that excess insulation material covers the fin structures 91. In some embodiments, a liner is first formed along surfaces of the substrate 50 and fin structures 91, and a fill material, such as those discussed above is formed over the liner. In some embodiments, the liner is omitted.

Next, a removal process is applied to the insulation material to remove excess insulation material over the fin structures 91. In some embodiments, a planarization process such as a chemical mechanical polish (CMP), an etch back process, combinations thereof, or the like may be utilized. The planarization process exposes the layer stacks 92 such that top surfaces of the layer stacks 92 and the insulation material are level after the planarization process is complete. Next, the insulation material is recessed to form the STI regions 96. The insulation material is recessed such that the layer stacks 92 protrude from between neighboring STI regions 96. Top portions of the semiconductor fins 90 may also protrude from between neighboring STI regions 96. Further, the top surfaces of the STI regions 96 may have a flat surface as illustrated, a convex surface, a concave surface (such as dishing), or a combination thereof. The top surfaces of the STI regions 96 may be formed flat, convex, and/or concave by an appropriate etch. The STI regions 96 may be recessed using an acceptable etching process, such as one that is selective to the material of the insulation material (e.g., etches the material of the insulation material at a faster rate than the material of the semiconductor fins 90 and the layer stacks 92). For example, a chemical oxide removal with a suitable etchant such as dilute hydrofluoric (dHF) acid may be used.

Still referring to FIGS. 4A and 4B, a dummy dielectric layer 97 is formed over the layer stack 92 and over the STI regions 96. The dummy dielectric layer 97 may be, for example, silicon oxide, silicon nitride, a combination thereof, or the like, and may be deposited or thermally grown according to acceptable techniques. In an embodiment, a layer of silicon is conformally formed over the layer stack 92 and over the upper surface of the STI regions 96, and a thermal oxidization process is performed to convert the deposited silicon layer into an oxide layer as the dummy dielectric layer 97.

Figures 5A, 5B:
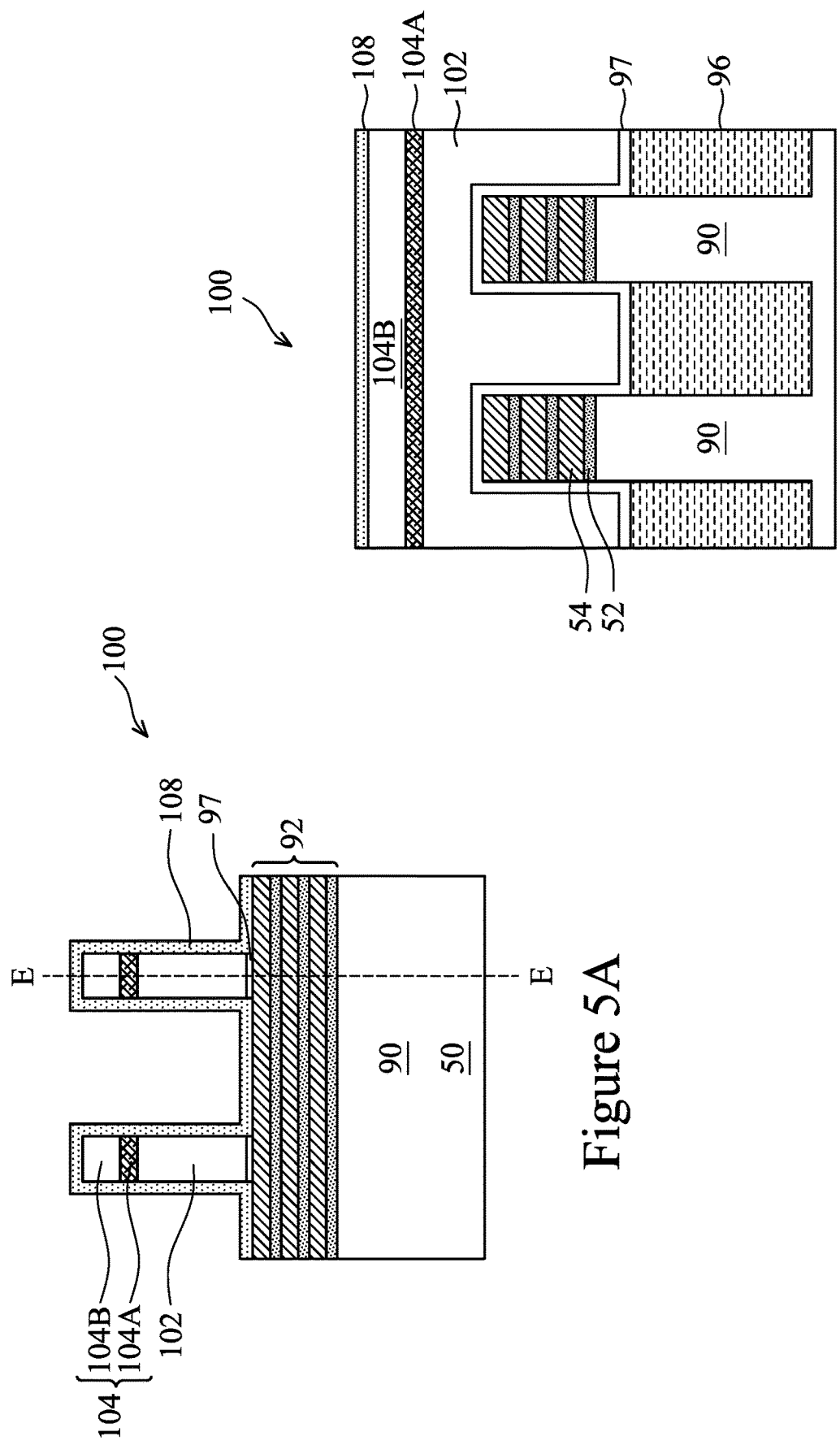

Next, in FIGS. 5A and 5B, dummy gates 102 are formed over the fin structures 91. To form the dummy gates 102, a dummy gate layer may be formed over the dummy dielectric layer 97. The dummy gate layer may be deposited over the dummy dielectric layer 97 and then planarized, such as by a CMP. The dummy gate layer may be a conductive material and may be selected from a group including amorphous silicon, polycrystalline-silicon (polysilicon), poly-crystalline silicon-germanium (poly-SiGe), or the like. The dummy gate layer may be deposited by physical vapor deposition (PVD), CVD, sputter deposition, or other techniques known and used in the art. The dummy gate layer may be made of other materials that have a high etching selectivity from the isolation regions 96.

Masks 104 are then formed over the dummy gate layer. The masks 104 may be formed from silicon nitride, silicon oxynitride, combinations thereof, or the like, and may be patterned using acceptable photolithography and etching techniques. In the illustrated embodiment, the mask 104 includes a first mask layer 104A (e.g., a silicon oxide layer) and a second mask layer 104B (e.g., a silicon nitride layer). The pattern of the masks 104 is then transferred to the dummy gate layer by an acceptable etching technique to form the dummy gates 102, and then transferred to the dummy dielectric layer by acceptable etching technique to form dummy gate dielectrics 97. The dummy gates 102 cover portions of the layer stacks 92 that correspond to the channel regions of the GAA FET formed. The pattern of the masks 104 may be used to physically separate each of the dummy gates 102 from adjacent dummy gates. The dummy gates 102 may also have a lengthwise direction substantially perpendicular to the lengthwise direction of the fin structure 91. The dummy gate 102 and the dummy gate dielectric 97 are collectively referred to as dummy gate structure, in some embodiments.

Next, a gate spacer layer 108 is formed by conformally depositing an insulating material over the layer stacks 92, STI regions 96, and dummy gates 102. The insulating material may be silicon nitride, silicon carbonitride, a combination thereof, or the like. In some embodiments, the gate spacer layer 108 includes multiple sublayers. For example, a first sublayer (sometimes referred to as a gate seal spacer layer) may be formed by thermal oxidation or a deposition, and a second sublayer (sometimes referred to as a main gate spacer layer) may be conformally deposited on the first sublayer.

FIG. 5B illustrates the cross-sectional view of the FeRAM device 100 in FIG. 5A along cross-sections E-E in FIG. 5A. The cross-section E-E corresponds to cross-section A-A in FIG. 1. Similarly, subsequent figures with the letter B (e.g., FIG. 6B) illustrates the cross-sectional view of the FeRAM device 100 along cross-sections E-E.

Figure 6A:
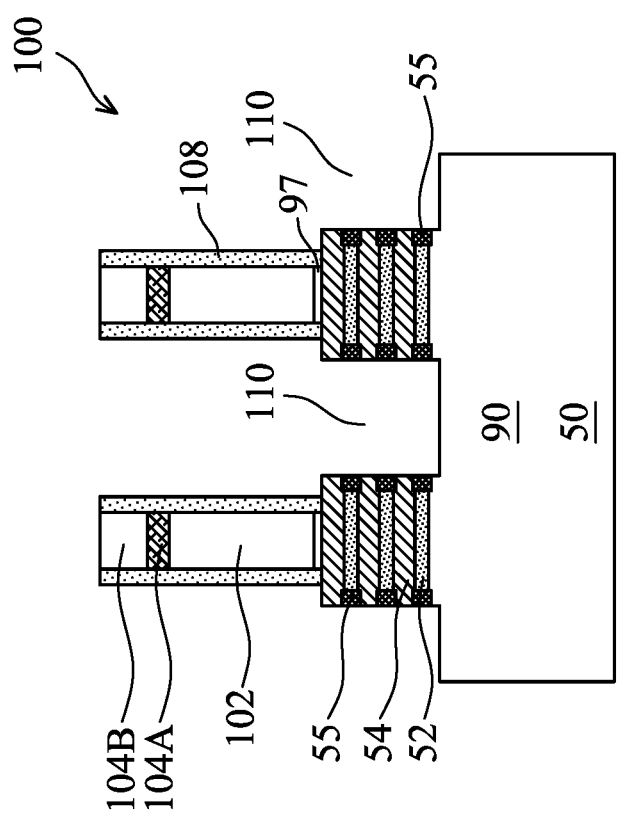
Figure 6B:
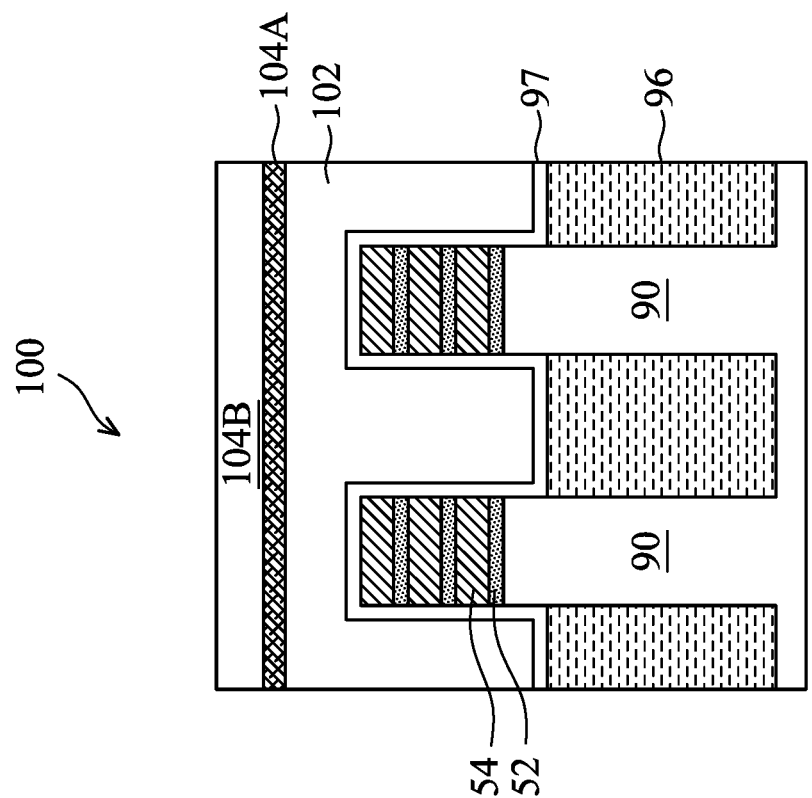

Next, in FIGS. 6A and 6B, the gate spacer layers 108 are etched by an anisotropic etching process to form gate spacers 108. The anisotropic etching process may remove horizontal portions of the gate spacer layer 108 (e.g., portions over the STI regions 96 and over the dummy gates 102), with remaining vertical portions of the gate spacer layer 108 (e.g., portions along sidewalls of the dummy gates 102 and along sidewalls of the dummy gate dielectric 97) forming the gate spacers 108.

After the formation of the gate spacers 108, implantation for lightly doped source/drain (LDD) regions (not shown) may be performed. Appropriate type (e.g., P-type or N-type) impurities may be implanted into the exposed layer stacks 92 and/or semiconductor fins 90. The N-type impurities may be any suitable N-type impurities, such as phosphorus, arsenic, antimony, or the like, and the P-type impurities may be any suitable P-type impurities, such as boron, $BF_2$, indium, or the like. The lightly doped source/drain regions may have a concentration of impurities of from about $10^{15}$ $cm^{-3}$ to about $10^{16}$ $cm^{-3}$. An anneal process may be used to activate the implanted impurities.

Next, openings 110 (which may also be referred to as recesses) are formed in the layer stacks 92. The openings 110 may extend through the layer stacks 92 and into the semiconductor fins 90. The openings 110 may be formed by any acceptable etching technique, using, e.g., the dummy gates 102 as etching masks.

After the openings 110 are formed, a selective etching process is performed to recess end portions of the first semiconductor material 52 exposed by the openings 110 without substantially attacking the second semiconductor material 54. After the selective etching process, recesses are formed in the first semiconductor material 52 at locations where the removed end portions used to be.

Next, an inner spacer layer is formed (e.g., conformally) in the opening 110. The inner spacer layer also fills the recesses in the first semiconductor material 52 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. Next, an etching process, such as an anisotropic etching process, is performed to remove portions of the inner spacer layers disposed outside the recesses in the first semiconductor material 52. The remaining portions of the inner spacer layers (e.g., portions disposed inside the recesses in the first semiconductor material 52) form the inner spacers 55.

Next, in FIGS. 7A and 7B, source/drain regions 112 are formed in the openings 110. In the illustrated embodiment, the source/drain regions 112 are formed of an epitaxial material(s), and therefore, may also be referred to as epitaxial source/drain regions 112. In some embodiments, the epitaxial source/drain regions 112 are formed in the openings 110 to exert stress in the respective channel regions of the GAA FET formed, thereby improving performance. The epitaxial source/drain regions 112 are formed such that each dummy gate 102 is disposed between respective neighboring pairs of the epitaxial source/drain regions 112. In some embodiments, the gate spacers 108 are used to separate the epitaxial source/drain regions 112 from the dummy gates 102 by an appropriate lateral distance so that the epitaxial source/drain regions 112 do not short out subsequently formed gates of the resulting GAA FET.

The epitaxial source/drain regions 112 are epitaxially grown in the openings 110, in some embodiments. The epitaxial source/drain regions 112 may include any acceptable material, such as appropriate for N-type or P-type device. For example, when N-type devices are formed, the epitaxial source/drain regions 112 may include materials exerting a tensile strain in the channel regions, such as silicon, SiC, SiCP, SiP, or the like. Likewise, when P-type devices are formed, the epitaxial source/drain regions 112 may include materials exerting a compressive strain in the channel regions, such as SiGe, SiGeB, Ge, GeSn, or the like. The epitaxial source/drain regions 112 may have surfaces raised from respective surfaces of the fins and may have facets.

The epitaxial source/drain regions 112 and/or the fins may be implanted with dopants to form source/drain regions, similar to the process previously discussed for forming lightly-doped source/drain regions, followed by an anneal. The source/drain regions may have an impurity concentration of between about $10^{19}$ $cm^{-3}$ and about $10^{21}$ $cm^{-3}$. The N-type and/or P-type impurities for source/drain regions may be any of the impurities previously discussed. In some embodiments, the epitaxial source/drain regions 112 may be in situ doped during growth.

As a result of the epitaxy processes used to form the epitaxial source/drain regions 112, upper surfaces of the epitaxial source/drain regions 112 have facets which expand laterally outward beyond sidewalls of the fins 90. In some embodiments, adjacent epitaxial source/drain regions 112 formed over adjacent fins 90 remain separated after the epitaxy process is completed. In other embodiments, adjacent epitaxial source/drain regions 112 over adjacent fins 90 merge to form a continuous source/drain region.

Next, a contact etch stop layer (CESL) 116 is formed (e.g., conformally) over the source/drain regions 112 and over the dummy gate 102, and a first inter-layer dielectric (ILD) 114 is then deposited over the CESL 116. The CESL 116 is formed of a material having a different etch rate than the first ILD 114, and may be formed of silicon nitride using PECVD, although other dielectric materials such as silicon oxide, silicon oxynitride, combinations thereof, or the like, and alternative techniques of forming the CESL 116, such as low pressure CVD (LPCVD), PVD, or the like, could alternatively be used.

The first ILD 114 may be formed of a dielectric material, and may be deposited by any suitable method, such as CVD, plasma-enhanced CVD (PECVD), or FCVD. Dielectric materials for the first ILD 114 may include silicon oxide, Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used.

Figure 8A:
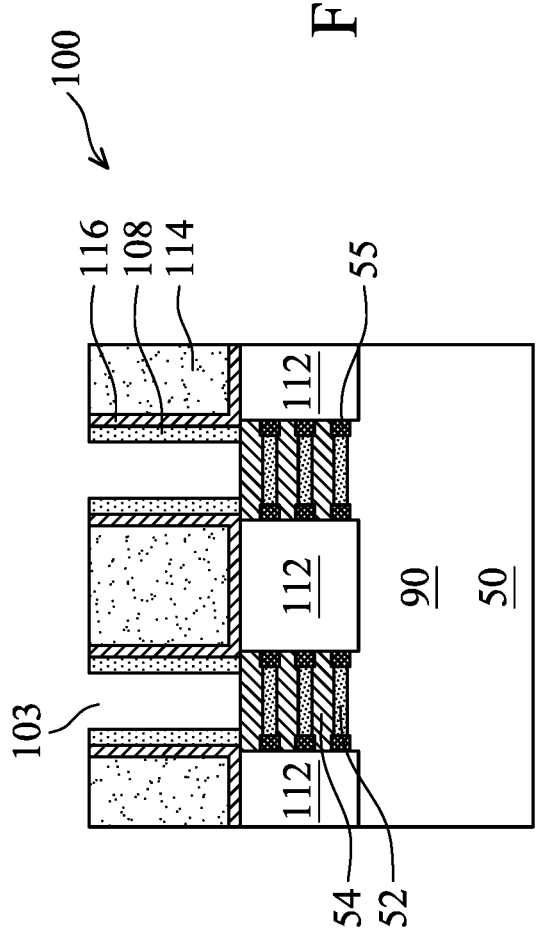
Figure 8B:
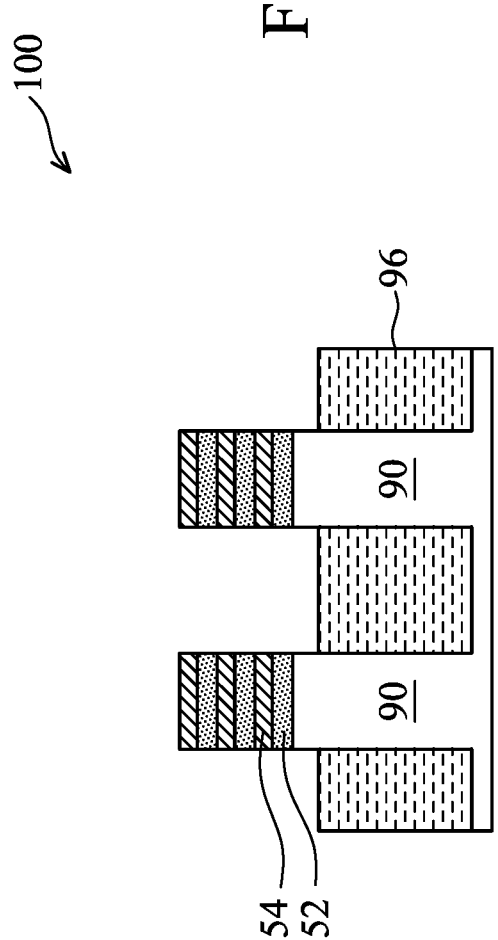

Next, in FIGS. 8A and 8B, the dummy gates 102 are removed. To remove the dummy gates 102, a planarization process, such as a CMP, is performed to level the top surfaces of the first ILD 114 and CESL 116 with the top surfaces of the dummy gates 102 and gate spacers 108. The planarization process may also remove the masks 104 (see FIG. 7A) on the dummy gates 102, and portions of the gate spacers 108 along sidewalls of the masks 104. After the planarization process, top surfaces of the dummy gates 102, gate spacers 108, and first ILD 114 are level. Accordingly, the top surfaces of the dummy gates 102 are exposed through the first ILD 114.

Next, the dummy gates 102 are removed in an etching step(s), so that recesses 103 are formed. In some embodiments, the dummy gates 102 are removed by an anisotropic dry etch process. For example, the etching process may include a dry etch process using reaction gas(es) that selectively etch the dummy gates 102 without etching the first ILD 114 or the gate spacers 108. Each recess 103 exposes a channel region of the GAA FET (e.g., portions of the layer stacks 92). Each channel region is disposed between neighboring pairs of the epitaxial source/drain regions 112. During the removal of the dummy gates 102, the dummy gate dielectric 97 may be used as an etch stop layer when the dummy gates 102 are etched. The dummy gate dielectric 97 may then be removed after the removal of the dummy gates 102.

Next, in FIGS. 9A and 9B, a mask layer 81 (may also be referred to as a mask material) is formed to fill the recesses 103. In some embodiments, the mask layer 81 is a photoresist formed using a suitable formation method, such as spin coating. As illustrated in FIGS. 9A and 9B, the mask layer 81 is formed to cover the upper surface and sidewalls of the layer stack 92. After the mask layer 81 is formed, a planarization process, such as CMP, may be performed to remove excess portions of the mask layer 81 from the upper surface of the first ILD 114.

Figure 10A:
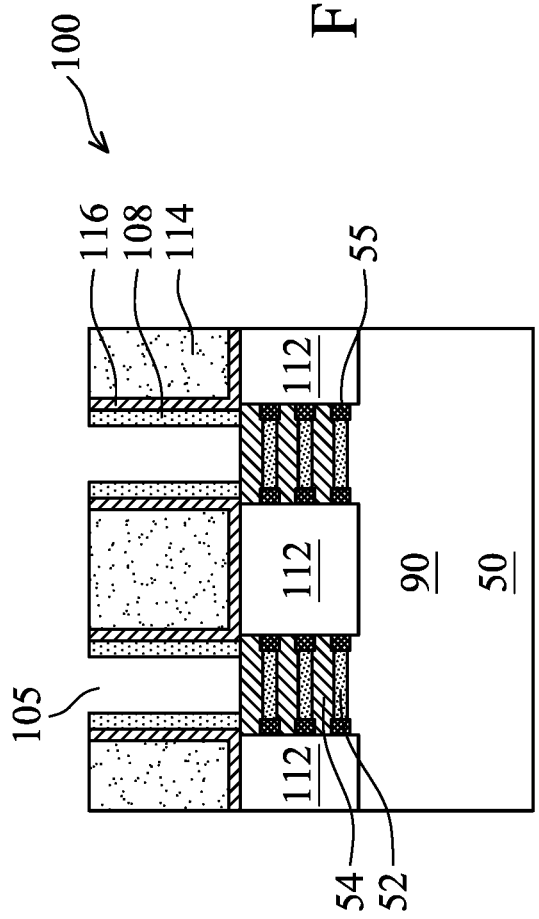
Figure 10B:
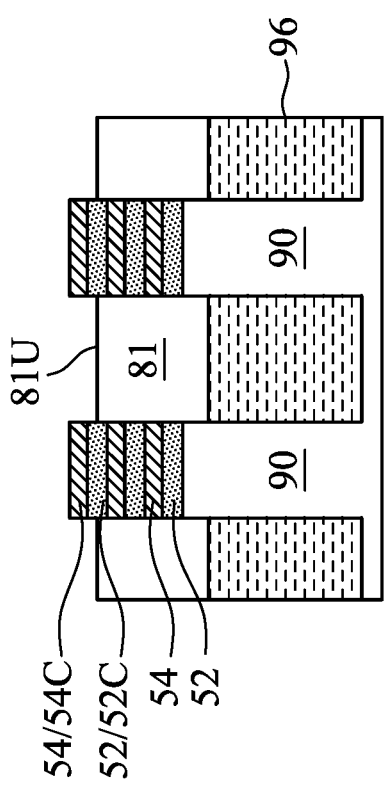

Next, in FIGS. 10A and 10B, the mask layer 81 is recessed to expose top portions of the layer stack 92, and recesses 105 are formed between gate spacers 108. A suitable etching process, e.g., an etching process using an etchant selective to (e.g., having a higher etching rate for) the mask layer 81, may be performed to recess the mask layer 81 without substantially attacking the other materials (e.g., 52, 54) of the FeRAM device 100.

In the example of FIG. 10B, the upper surface 81U of the recessed mask layer 81 is between an upper surface and a lower surface of the layer 52C of the first semiconductor material 52, such that the top layer 54C of the second semiconductor material 54 is exposed. In subsequent processing, the exposed top layer 54C is removed (e.g., by a selective wet etch process) such that the number of layers of the second semiconductor material 54 in the subsequently formed nanostructure 54 (e.g., nanosheets, see FIG. 12B) is adjusted (e.g., reduced) to a pre-determined number. Note that FIG. 10B shows the top layer 54C of the second semiconductor material 54 being exposed by the recessed mask layer 81 as a non-limiting example, the number of layers of the second semiconductor material 54 being exposed by the recessed mask layer 81 may be any suitable number, depending on the design of the FeRAM device 100. For example, to remove the top two layers of the second semiconductor material 54, the upper surface 81U of the recessed mask layer 81 may be between an upper surface and a lower surface of the layer 52B of the first semiconductor material 52, such that layers 54C and 54B of the second semiconductor material 54 are exposed and then removed by a subsequent selective etching processing.

Figure 11A:
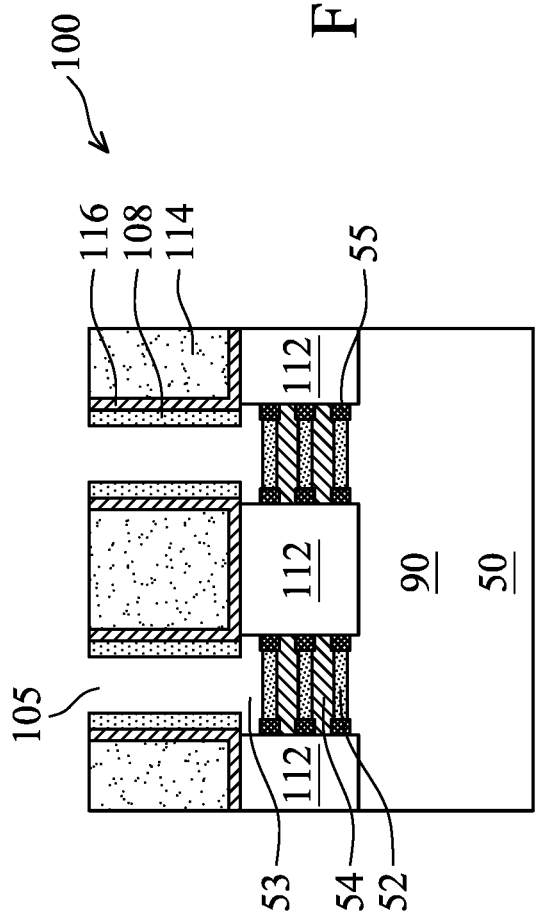
Figure 11B:
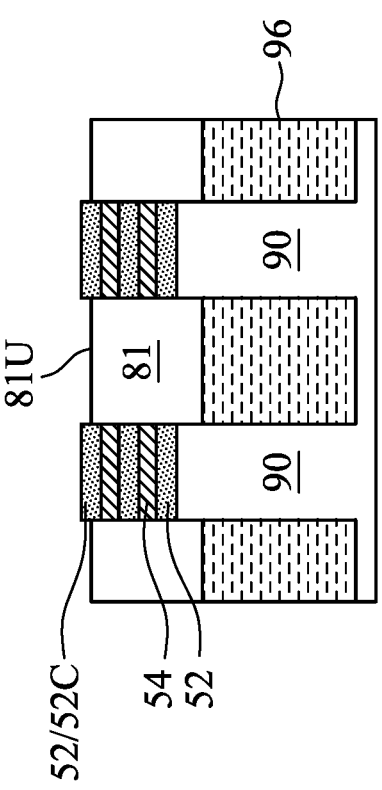

Next, in FIGS. 11A and 11B, the exposed layer(s) (e.g., 54C) of the second semiconductor material 54 is removed. For example, a selective etching process (e.g., a wet etch process) that uses an etchant selective to the second semiconductor material 54 is performed to remove the exposed layer(s) of the second semiconductor material 54. In the example of FIG. 11A, the bottom of the recess 105 is expanded to include the empty space 53 where the top layer 54C used to be. In particular, the upper portion (e.g., portion proximate to the upper surface of the first ILD 114) of the recess 105 has a first width that is smaller than a second width of the lower portion (e.g., 53) of the recess 105.

Figure 12A:
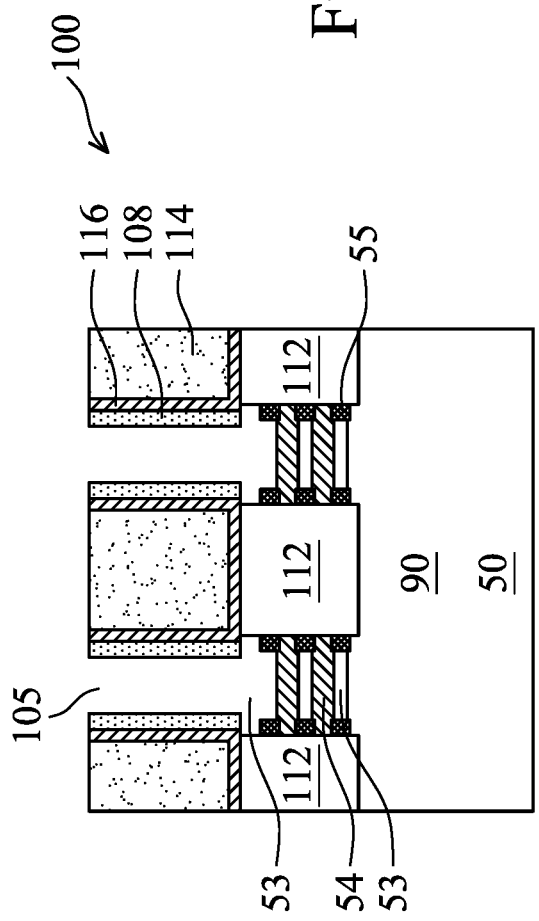
Figure 12B:
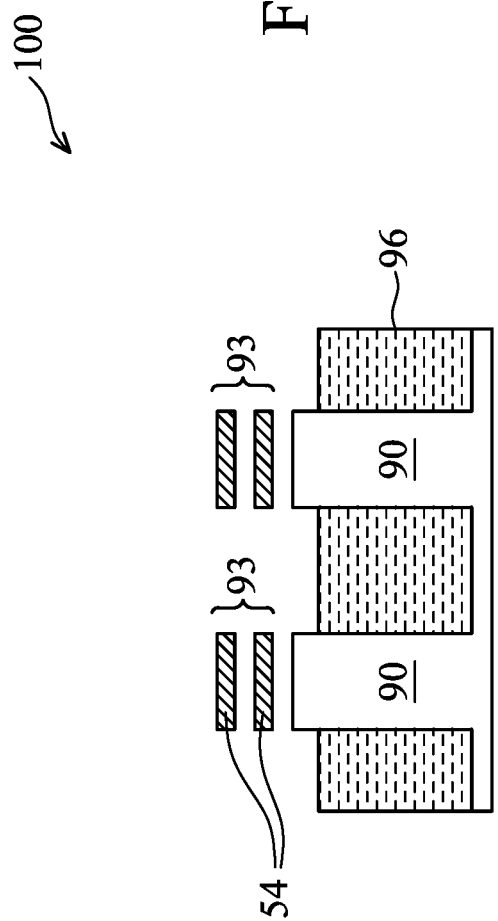

Next, in FIGS. 12A and 12B, the mask layer 81 is removed. In embodiments where the mask layer 81 is a photoresist, the mask layer 81 may be removed by, e.g., an ashing process. Next, the first semiconductor material 52 is selectively removed to release the second semiconductor material 54, such that the released second semiconductor material 54 forms a plurality of nanostructures 54. Depending on the aspect ratio of the nanostructures 54 in FIG. 12B, the nanostructures 54 may be referred to as nanosheets or nanowires, in some embodiments. In FIGS. 12A and 12B, the nanostructures 54 extend horizontally (e.g., substantially parallel to a major upper surface of the substrate 50) and are separated from each other. Nanostructures 54 formed by layers of the second semiconductor material 54 in a same layer stack 92 are vertically aligned. The nanostructures 54 may be collectively referred to as the channel regions 93 or the channel layers 93 of the FeRAM device 100 formed. As illustrated in FIG. 12A, empty spaces 53 (e.g., gaps) are formed by the removal of the first semiconductor material 52.

In some embodiments, the first semiconductor material 52 is removed by a selective etching process using an etchant that is selective to the first semiconductor material 52, such that the first semiconductor material 52 is removed without substantially attacking the second semiconductor material 54. In some embodiments, an isotropic etching process is performed to remove the first semiconductor material 52. In some embodiments, the isotropic etching process is performed using an etching gas, and optionally, a carrier gas, where the etching gas comprises $F_2$ and HF, and the carrier gas may be an inert gas such as Ar, He, $N_2$, combinations thereof, or the like.

The nanostructure removal processing illustrated in FIGS. 9A, 9B, 10A, 10B, 11A and 11B allows the number of layers in the nanostructure 54 to be adjusted (e.g., reduced) from the originally number of layers of the second semiconductor material 54 formed in FIG. 2. This allows the area of the channel regions 93 of the GAA FET in the FeRAM device 100 to be adjusted, where the area of the channel regions 93 is the sum of the exterior surface areas of the nanostructures 54. Note that by forming the nanostructure 54 (e.g., nanosheets or nanowires), the area of the channel regions 93 is increased compared to a FinFET device with fins 90 only (e.g., without nanostructures 54), in some embodiments. Having the ability to adjust the area of the channel regions 93 advantageously improves the performance of the FeRAM device 100, as described in more details hereinafter. In some embodiments, the nanostructure removal processing illustrated in FIGS. 9A, 9B, 10A, 10B, 11A and 11B is omitted, such that the number of layers in the nanostructures 54 is the same as the number of originally deposited layers of the second semiconductor material 54.

Figure 13A:
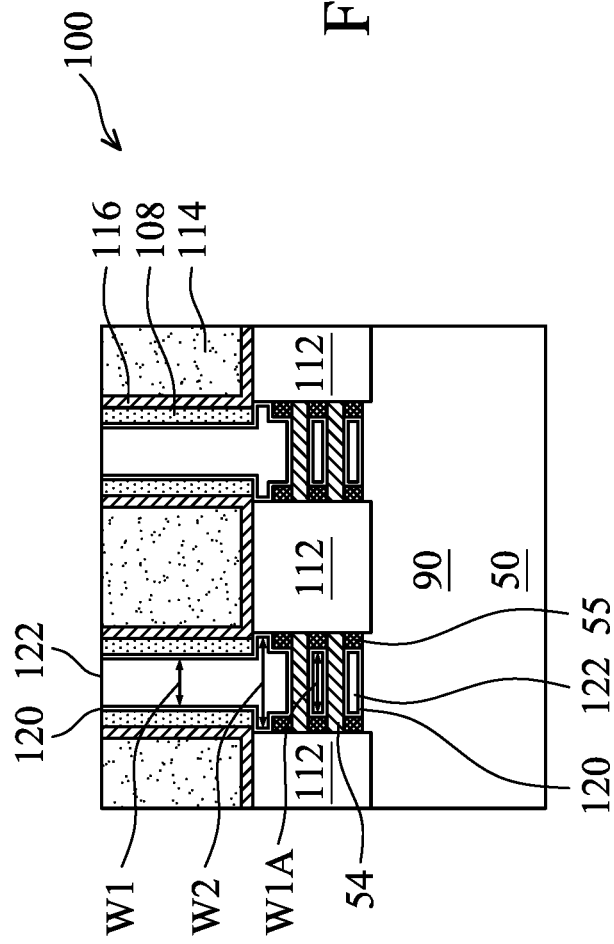
Figure 13B:
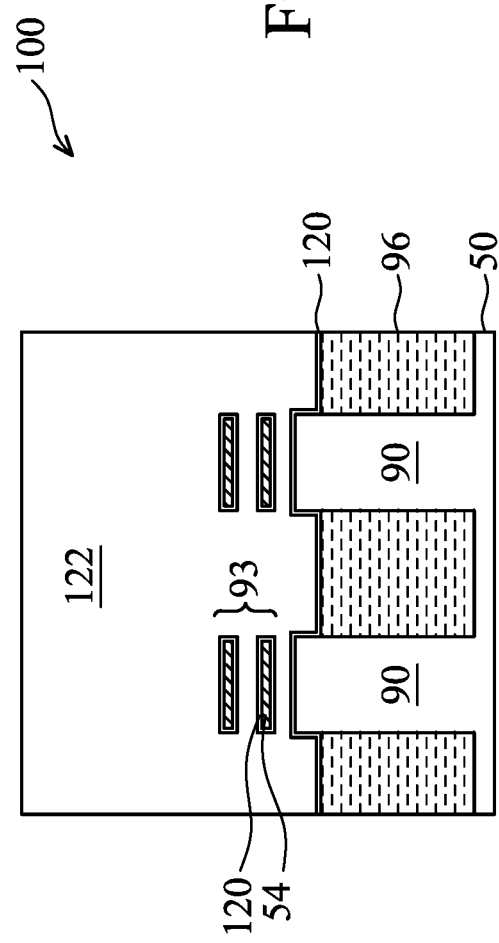

Next, in FIGS. 13A and 13B, gate dielectric layers 120 and gate electrodes 122 are formed for replacement gates. The gate dielectric layers 120 are deposited conformally in the recesses 105, such as on the top surfaces and the sidewalls of the semiconductor fins 90, and on sidewalls of the gate spacers 108. The gate dielectric layers 120 may also be formed on the top surface of the first ILD 114. Notably, the gate dielectric layers 120 wrap around the nanostructures 54. In accordance with some embodiments, the gate dielectric layers 120 comprise silicon oxide, silicon nitride, or multilayers thereof. In some embodiments, the gate dielectric layers 120 include a high-k dielectric material, and in these embodiments, the gate dielectric layers 120 may have a k value greater than about 7.0, and may include a metal oxide or a silicate of Hf, Al, Zr, La, Mg, Ba, Ti, or Pb, or combinations thereof. The formation methods of the gate dielectric layers 120 may include Molecular-Beam Deposition (MBD), ALD, PECVD, and the like.

Next, the gate electrodes 122 are formed over and around the gate dielectric layers 120, and fill the remaining portions of the recesses 105. The gate electrodes 122 may include a metal-containing material such as TiN, TiO, TaN, TaC, Co, Ru, Al, W, combinations thereof, or multi-layers thereof. Although a single layer gate electrode 122 is illustrated, the gate electrode 122 may comprise any number of liner layers (e.g., barrier layers), any number of work function tuning layers, and a fill metal. After the formation of the gate electrodes 122, a planarization process, such as a CMP, may be performed to remove excess portions of the gate dielectric layers 120 and the material of the gate electrodes 122, which excess portions are over the upper surface of the first ILD 114. The remaining portions of material of the gate electrodes 122 and the gate dielectric layers 120 thus form replacement gates of the resulting FeRAM device 100. Each gate electrode 122 and the corresponding gate dielectric layers 120 may be collectively referred to as a gate stack, a replacement gate structure, or a metal gate structure. Each metal gate structure extends around the respective nanostructures 54. In the example of FIG. 13A, the gate electrode 122 has a width W1 at an upper portion, and has a width W2 at a location proximate to the topmost nanostructure 54 (e.g., at the location where the removed top layer 54C of the second semiconductor material 54 used to be), where W1 is smaller than W2. In addition, the gate electrode 122 has a width W1A at a location between nanostructures 54 (or between a lowermost nanostructure 54 and the fin 90), where W1A is smaller than W2.

In some embodiments, an interfacial layer 95 (not illustrated in FIGS. 13A and 13B but illustrated in FIG. 15) is formed around the nanostructures 54 before the gate dielectric layer 120 is formed. The interfacial layer 95 may be an oxide (e.g., silicon oxide) of the material of the nanostructure 54, and may be formed by, e.g., a thermal oxidation process, although the interfacial layer may also be formed by a suitable deposition method such as ALD.

Figure 14A:
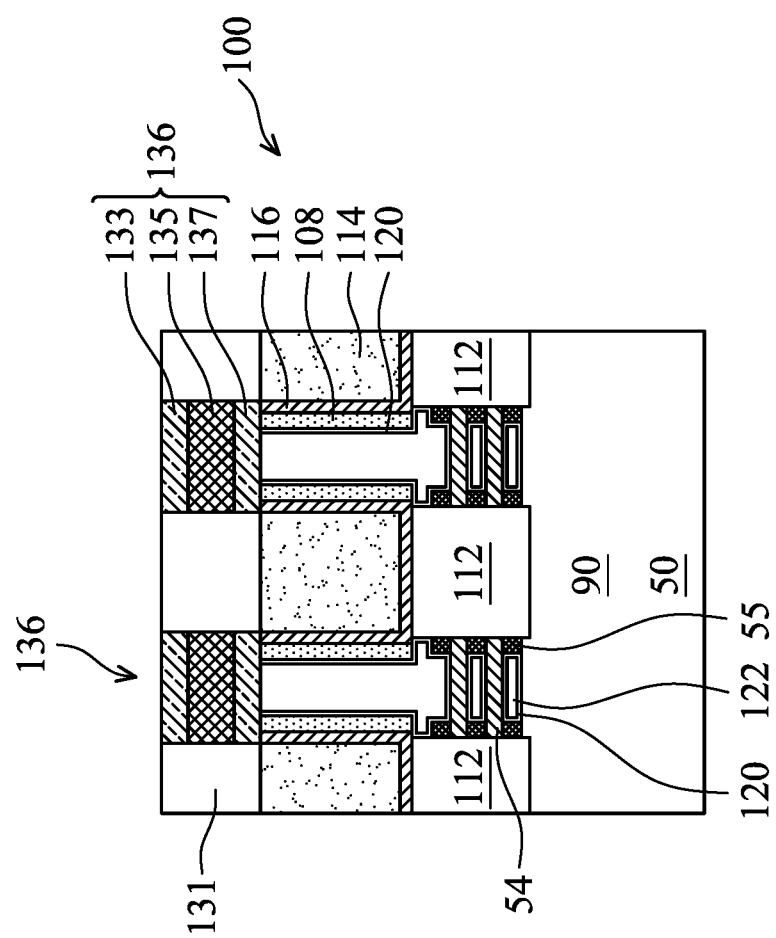
Figure 14B:
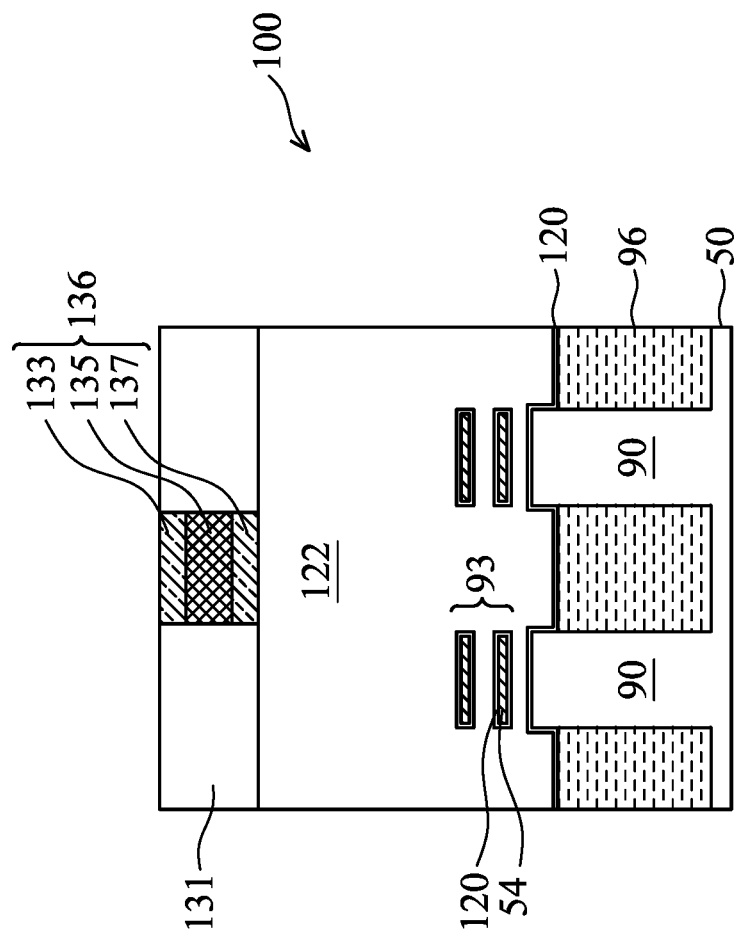

Next, in FIGS. 14A and 14B, ferroelectric capacitors 136 are formed over and electrically coupled to the metal gate structures. In particular, each of the ferroelectric capacitor 136 is electrically coupled to the metal gate structure of an underlying GAA FET to form a 1T-1C FeRAM memory cell.

In some embodiments, the ferroelectric capacitors 136 are formed by successively forming a bottom electrode layer 137, a ferroelectric layer 135, and a top electrode layer 133 over the metal gate structures and over the upper surface of the first ILD 114, then patterning the deposited layers to form the bottom electrodes 137, the ferroelectric layer 135, and the top electrode 133 of the ferroelectric capacitors 136.

In some embodiments, the bottom electrode layer 137 is formed using an electrically conductive material, such as Cu, W, TiN, TaN, Ru, Co, or the like, using any suitable formation method, such as CVD, PVD, ALD, or the like. A thickness of the bottom electrode layer 137 is between about 3 nm and about 20 nm, in some embodiments. As illustrated in FIGS. 14A and 14B, the ferroelectric layer 135 is formed over the bottom electrode layer 137. The ferroelectric layer 135 comprises a ferroelectric material, such as HfO2, HfZrO2, ZrO2, or HfO2 doped by La, Y, Si, or Ge, in some embodiments. A thickness of the ferroelectric layer 135 may be between about 3 nm and about 20 nm. Any suitable formation method, such as ALD, CVD, PVD, or the like, may be used to form the ferroelectric layer 135. In some embodiments, the top electrode layer 133 comprises an electrically conductive material such as Cu, W, TiN, TaN, Ru, Co, or the like, and is formed using any suitable formation method. A thickness of the top electrode layer 133 is between about 3 nm and about 20 nm, in some embodiments. The deposited layers are next patterned using, e.g., photolithography and etching techniques to from the respective layers of the ferroelectric capacitors 136.

As illustrated in FIGS. 14A and 14B, a dielectric layer 131 is formed over the first ILD 114 around the ferroelectric capacitors 136. The dielectric layer 131 may be formed of any suitable dielectric material, such as silicon oxide, silicon nitride, or the like, using a suitable formation method such as PVD, CVD, or the like. A planarization process, such as CMP, may be performed such that the dielectric layer 131 and the ferroelectric capacitors 136 have a coplanar upper surface.

Additional processing may be performed to finish fabrication of the FeRAM device 100, as one of ordinary skill readily appreciates, thus details may not be discussed here. For example, additional dielectric layers may be formed over the dielectric layer 131. Further, additional electrically conductive features, such as conductive lines (e.g., copper lines) and vias may be formed in the first ILD 114 and/or its overlying dielectric layers to electrically couple to the top electrode 133 of the ferroelectric capacitors 136 or the source/drain regions 112.

Figure 15:
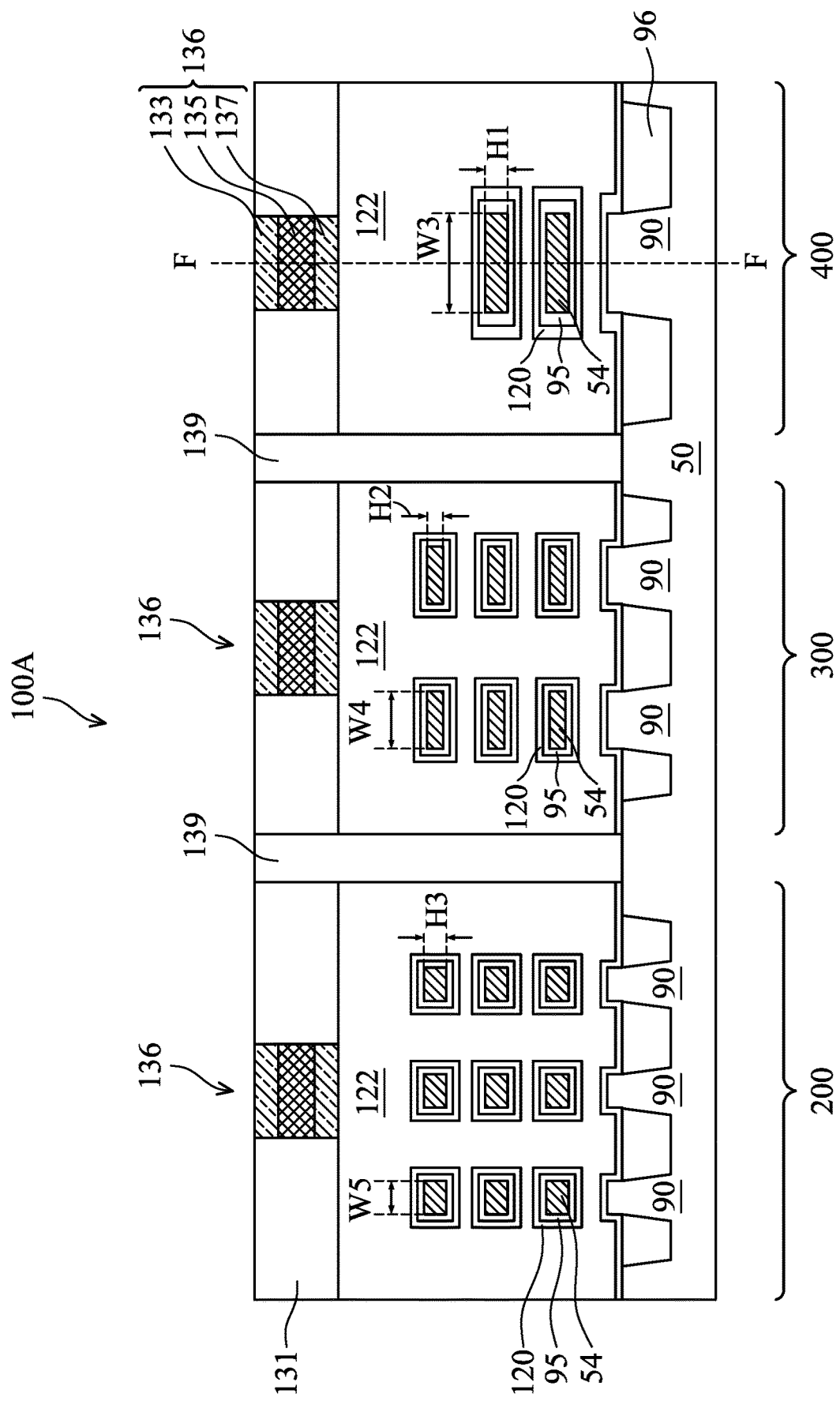
FIG. 15 illustrates a cross-sectional view of an FeRAM device, in accordance with another embodiment.

FIG. 15 illustrates a cross-sectional view of an FeRAM device 100A, in accordance with another embodiment. The FeRAM device 100A is similar to the FeRAM device 100 of FIG. 14B, but with multiple device regions 200, 300, and 400. The cross-sectional view of the FeRAM device 100A along, e.g., the cross-section F-F in FIG. 15 may be the same as or similar to that in FIG. 14A. As illustrated in FIG. 15, isolation structures 139 are formed between different device regions to separate the gate electrodes 122. The isolation structures 139 are formed of a dielectric material, such as silicon oxide, silicon nitride, silicon oxynitride, or the like, in some embodiments. In the example of FIG. 15, the isolation structures 139 extend from the gate dielectric layer 120 at the bottom of the gate electrode 122 to an upper surface of the dielectric layer 131 distal from the substrate 50.

In FIG. 15, each device region (e.g., 200, 300, or 400) includes a 1T-1C FeRAM memory cell that includes a ferroelectric capacitor 136 coupled to the gate electrode 122 of an underlying GAA FET. In particular, in each of the device regions 200, 300, and 400, the number of rows and/or the number of columns for the nanostructures 54 of the GAA FET are different. In addition, the heights (e.g., H1, H2, H3) and the widths (e.g., W3, W4, W5) of the nanostructures 54 in different device regions may also be different. The different structure and/or dimensions for the nanostructures 54 in different device region may be achieved by adapting/repeating the processing steps for forming the FeRAM device 100 for each device region while covering other device region with a mask layer.

In some embodiments, the number of columns of the nanostructures 54 in each device region 200/300/400, which is equivalent to the number of fins 90 in each device region, is determined by the pattern of the mask 94 used to form the fins 90 (see, e.g., FIGS. 3A and 3B). In some embodiments, the number of rows of the nanostructures 54 in each device region is determined by the number of layers (e.g., 54A, 54B, 54C in FIG. 2) originally deposited in each device region and the number of layers (e.g., 54C in FIG. 10B) removed by the nanostructure removal process discussed above with reference to FIGS. 9A, 9B, 10A, 10B, 11A, and 11B.

In some embodiments, the width (e.g., W3, W4, or W5) of the nanostructures 54 in each device region is determined by the width of the mask 94 used to form the fins 90 (see, e.g., FIGS. 3A and 3B) in that device region. In some embodiments, the height (e.g., H1, H2, or H3) of the nanostructures 54 in each device region is determined by the thickness of the originally deposited layers (e.g., 54A, 54B, 54C in FIG. 2) in each device region. In other words, to form the FeRAM device 100A, each device region (e.g., 200, 300, or 400) may have different numbers of layers of the semiconductor material 52/54 formed and/or different layers of the second semiconductor material 54 removed by the nanostructure removal process, and the thicknesses of the layers of the semiconductor material 52/54 may be formed to be different to accommodate the different heights (e.g., H1, H2 and H3) of the nanostructures 54 in different device regions.

Therefore, by adjusting the number of layers of the semiconductor materials 52/54 in the multi-layer stack 64 in each device region, by adjusting the shape/dimension of the mask 94 used to form the fins 90, and by adjusting how many layers (e.g., 54C in FIG. 10B) of the nanostructures 54 are removed by the nanostructure removal process, the area of the channel region 93 in each device region can be adjusted. Therefore, the FeRAM devices disclosed herein (e.g., 100 and 100A) offer great flexibility in tuning the area of the channel regions 93 of the GAA FET in each device region. In some embodiments, the ratio between the area of the channel regions of the GAA FET and the area of the ferroelectric capacitor (e.g., area of the ferroelectric layer 135 in a top view) in the 1T-1C FeRAM memory cell determines the device performance (e.g., threshold voltage shift). The disclosed structures of the FeRAM devices (e.g., 100, 100A) thereby offer great flexibility in tuning the device performance (e.g., threshold voltage shift), as discussed in details below.

In some embodiments, the ferroelectric layer 135 of the ferroelectric capacitor 136 in the FeRAM device (e.g., 100 or 100A) with a 1T-1C structure has two electrical polarization directions, which are used to store the digital value (e.g., 0 or 1) in the FeRAM memory cell. For example, when the ferroelectric layer 135 in the 1T-1C FeRAM memory cell has a first electrical polarization direction, the GAA FET in the 1T-1C memory cell has a first threshold voltage (e.g., 1V). When the ferroelectric layer 135 in the 1T-1C FeRAM memory cell has a second electrical polarization direction, the GAA FET has a second threshold voltage (e.g., 2V). The difference between the two threshold voltages may be referred to as the threshold voltage shift. A larger threshold voltage shift makes it easier (e.g., less error prone) to read out the digital value stored in the memory cell. For example, when a read voltage (e.g., a voltage between the two threshold voltages) is applied to the GAA FET (e.g., applied at the top electrode 133), depending on the polarization direction of the ferroelectric layer 135 (thus the threshold voltage), the GAA FET in the 1T-1C memory cell may or may not be turned on, which results in different amount of current flowing through the GAA FET. The difference in the current flowing through the GAA FET is used to determine the digital value stored in the memory cell. In the example above with two threshold voltages of 1V and 2V, assuming a read voltage of 1.5V is used, a ±0.5V margin is available to tolerate device variations.

With the presently disclosed structure for the FeRAM device, a larger difference (e.g., a larger ratio) between the area of the channel regions 93 (e.g., exterior surface areas of the nanostructures 54 surrounded by the gate electrode 122) of the GAA FET and the area of the ferroelectric layer 135 in the ferroelectric capacitor 136 is achieved, which increases the threshold voltage shift for the FeRAM memory cell formed. For the example above, the two threshold voltages (e.g., 1V and 2V) may become 0.5V and 2.5V, respectively, which allows for a read voltage of 1.5V to be used, with a ±1V margin to tolerate more device variations, thus is more reliable and less error prone. In addition, the disclosed structures and formation methods for the FeRAM devices can be readily integrated into existing manufacturing flow to achieve improved device performance and tuning capability.

Variations of the disclosed embodiments are possible and are fully intended to be included within the scope of the present disclosure. For example, depending on the type of device (e.g., N-type or P-type device) formed, the second semiconductor material 54 may be removed, and the first semiconductor material 52 may remain to form the nanostructures.

Figure 16:
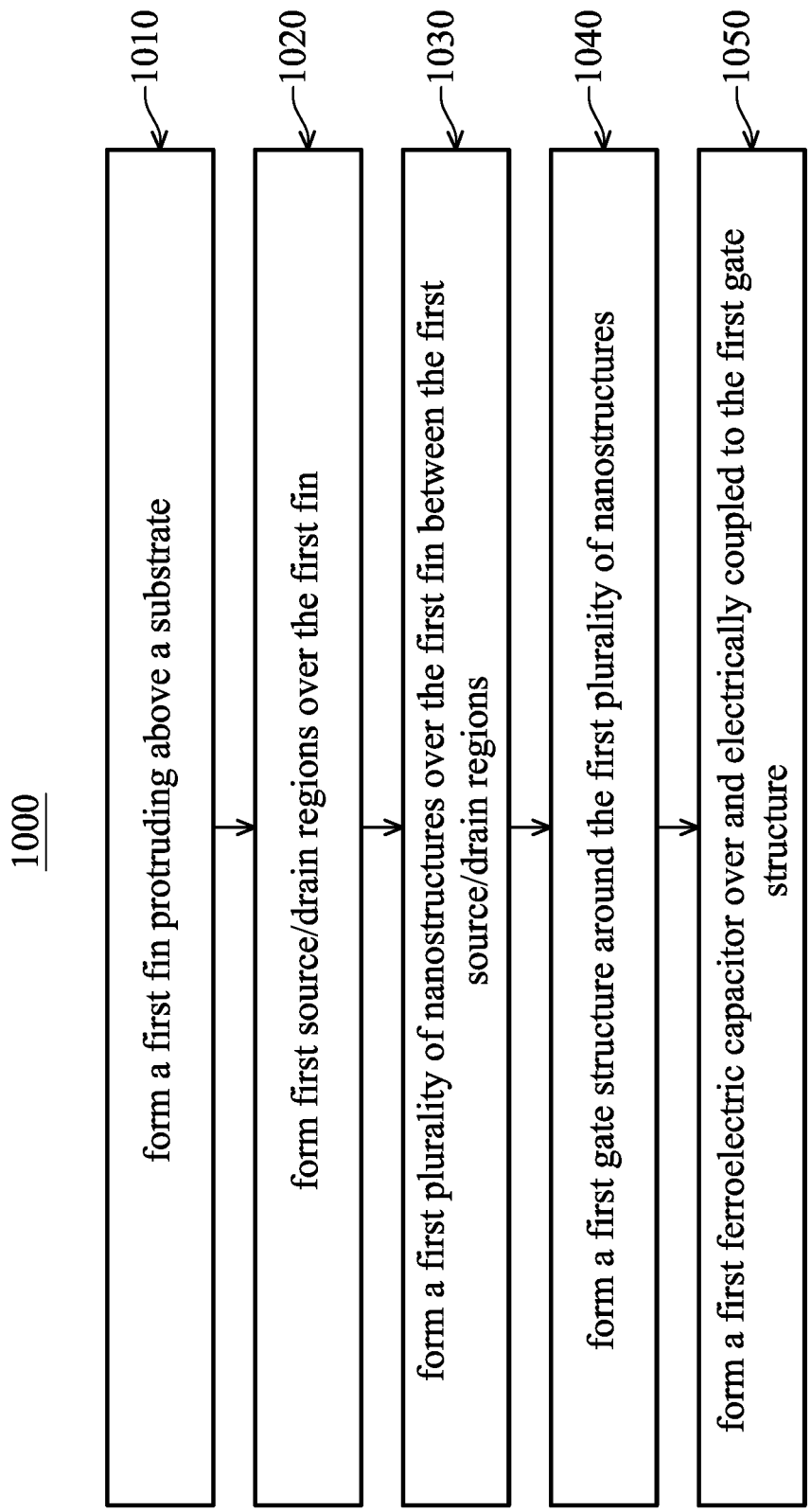
FIG. 16 is a flow chart of a method of forming a semiconductor device, in some embodiments.

FIG. 16 illustrates a flow chart of a method 1000 of fabricating a semiconductor device, in accordance with some embodiments. It should be understood that the embodiment method shown in FIG. 16 is merely an example of many possible embodiment methods. One of ordinary skill in the art would recognize many variations, alternatives, and modifications. For example, various steps as illustrated in FIG. 16 may be added, removed, replaced, rearranged, or repeated.

Referring to FIG. 16, at step 1010, a first fin is formed protruding above a substrate. At step 1020, first source/drain regions are formed over the first fin. At step 103o, a first plurality of nanostructures are formed over the first fin between the first source/drain regions. At step 1040, a first gate structure is formed around the first plurality of nanostructures. At step 1050, a first ferroelectric capacitor is formed over and electrically coupled to the first gate structure.

Embodiments may achieve advantages. With the presently disclosed structure for the FeRAM device, the area of the channel regions of the GAA FET in the FeRAM device can be flexibly adjusted. In addition, different devices regions of the FeRAM device may be adjusted differently. As a result, a large ratio between the area of the channel regions 93 of the GAA FET and the area of the ferroelectric layer 135 in the ferroelectric capacitor 136 is achieved, which increases the threshold voltage shift for the FeRAM memory cell formed and allows for easier read operation of the FeRAM device with more tolerance for device variations. In addition, the disclosed structures and formation methods for the FeRAM devices can be readily integrated into existing manufacturing flow to achieve improved device performance and tuning capability.

In an embodiment, a method of forming a semiconductor device includes: forming a first fin protruding above a substrate; forming first source/drain regions over the first fin; forming a first plurality of nanostructures over the first fin between the first source/drain regions; forming a first gate structure around the first plurality of nanostructures; and forming a first ferroelectric capacitor over and electrically coupled to the first gate structure. In an embodiment, forming the first plurality of nanostructures comprises: forming a first layer stack over the first fin, the first layer stack comprising alternating layers of a first semiconductor material and a second semiconductor material; and after forming the first source/drain regions, selectively removing the first semiconductor material of the first layer stack, wherein after the selective removing, the second semiconductor material of the first layer stack remain to form the first plurality of nanostructures. In an embodiment, forming the first plurality of nanostructures further comprises, before selectively removing the first semiconductor material, removing at least a top layer of the second semiconductor material of the first layer stack. In an embodiment, removing the top layer of the second semiconductor material comprises: forming a mask layer around the first layer stack, the mask layer extending further from the substrate than the first layer stack; recessing the mask layer to expose at least the top layer of the second semiconductor material of the first layer stack; and performing an etching process using an etchant selective to the second semiconductor material to remove at least the exposed top layer of the second semiconductor material. In an embodiment, forming the first gate structure comprises: forming a gate dielectric layer around the first plurality of nanostructures; and forming an electrically conductive material around the gate dielectric layer to form a gate electrode, wherein the gate electrode has a first width at a first location of the removed top layer of the second semiconductor material, wherein the gate electrode has a second width at a second location between the first plurality of nanostructures, wherein the first width is larger than the second width. In an embodiment, forming the first plurality of nanostructures further comprises, after forming the first layer stack and before the selective removing: recessing end portions of the first semiconductor material to form recesses in the first semiconductor material; and forming inner spacers in the recesses. In an embodiment, forming the first ferroelectric capacitor comprises: forming a bottom electrode over and electrically coupled to the first gate structure; forming a ferroelectric film over the bottom electrode; and forming a top electrode over the ferroelectric film. In an embodiment, the method further comprises: forming a second fin over the substrate; forming second source/drain regions in the second fin; forming a second plurality of nanostructures over the second fin between the second source/drain regions, wherein the first plurality of nanostructures has a first number of layers of the second semiconductor material, and the second plurality of nanostructures has a second number of layers of the second semiconductor material, wherein the first number is different from the second number; forming a second gate structure around the second plurality of nanostructures; and forming a second ferroelectric capacitor over and electrically coupled to the second gate structure. In an embodiment, the first plurality of nanostructures is formed to have a first width, and the second plurality of nanostructures is formed to have a second width different from the first width. In an embodiment, a first layer of the second semiconductor material in the first plurality of nanostructures has a first height, and a second layer of the second semiconductor material in the second plurality of nanostructures has a second height different from the first height. In an embodiment, the method further includes forming an isolation structure between the first gate structure and the second gate structure, wherein an upper surface of the isolation structure distal from the substrate is level with an upper surface of the first ferroelectric capacitor.

In an embodiment, a method of forming a semiconductor device includes: forming a first fin and a second fin that protrude above a substrate, the first fin being parallel to the second fin; forming a first plurality of nanostructures over the first fin, the first plurality of nanostructures comprising a first number of layers of a first semiconductor material that are separate from each other; forming a second plurality of nanostructures over the second fin, the second plurality of nanostructures comprising a second number of layers of the first semiconductor material that are separate from each other, the second number being smaller than the first number; forming first source/drain regions on opposing ends of the first plurality of nanostructures; forming second source/drain regions on opposing ends of the second plurality of nanostructures; forming a first gate structure around the first plurality of nanostructures; and forming a second gate structure around the second plurality of nanostructures. In an embodiment, the method further includes: forming a first ferroelectric capacitor over and electrically coupled to the first gate structure; and forming a second ferroelectric capacitor over and electrically coupled to the second gate structure. In an embodiment, the method further includes forming an isolation structure between the first gate structure and the second gate structure. In an embodiment, forming the second plurality of nanostructures includes: forming a layer stack over the second fin, the layer stack comprising alternating layers of the first semiconductor material and a second semiconductor material; removing a top layer of the first semiconductor material of the layer stack distal from the substrate; and after removing the top layer of the first semiconductor material, selectively removing the second semiconductor material, remaining layers of the first semiconductor material of the layer stack forming the second plurality of nanostructures. In an embodiment, removing the top layer of the first semiconductor material comprises: forming a mask layer over the layer stack; recessing the mask layer to expose the top layer of the first semiconductor material of the layer stack; and removing the exposed top layer of the first semiconductor material.

In an embodiment, a semiconductor device includes: a substrate; a first fin over the substrate; a first plurality of nanostructures over the first fin, the first plurality of nanostructures comprising a first number of layers of a first semiconductor material; a first gate structure around the first plurality of nanostructures; a second fin over the substrate adjacent to the first fin; a second plurality of nanostructures over the second fin, the second plurality of nanostructures comprising a second number of layers of the first semiconductor material, the second number being different from the first number; a first gate structure around the first plurality of nanostructures; and a second gate structure around the second plurality of nanostructures. In an embodiment, the semiconductor device further includes: a first ferroelectric capacitor over and electrically coupled to the first gate structure; and a second ferroelectric capacitor over and electrically coupled to the second gate structure. In an embodiment, the first plurality of nanostructures have a first width and are disposed in a first number of columns, and the second plurality of nanostructures have a second width different from the first width and are disposed in a second number of columns different from the first number of columns. In an embodiment, the first number of layers of the first semiconductor material in the first plurality of nanostructures have a first thickness, and the second number of layers of the first semiconductor material in the second plurality of nanostructures have a second thickness different from the first thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first fin protruding above a substrate;
    forming a first layer stack over the first fin, the first layer stack comprising alternating layers of a first semiconductor material and a second semiconductor material;
    forming first source/drain regions over the first fin;
    forming a first plurality of nanostructures over the first fin between the first source/drain regions, wherein forming the first plurality of nanostructures comprises:
        removing at least a top layer of the second semiconductor material of the first layer stack; and
        after removing at least the top layer of the second semiconductor material, selectively removing the first semiconductor material of the first layer stack, wherein after the selective removing, the second semiconductor material of the first layer stack remain to form the first plurality of nanostructures;
    forming a first gate structure around the first plurality of nanostructures; and
    forming a first ferroelectric capacitor over and electrically coupled to the first gate structure.

2. The method of claim 1, wherein removing the top layer of the second semiconductor material comprises:
    forming a mask layer around the first layer stack, the mask layer extending further from the substrate than the first layer stack;
    recessing the mask layer to expose at least the top layer of the second semiconductor material of the first layer stack; and
    performing an etching process using an etchant selective to the second semiconductor material to remove at least the exposed top layer of the second semiconductor material.

3. The method of claim 1, wherein forming the first gate structure comprises:
    forming a gate dielectric layer around the first plurality of nanostructures; and
    forming an electrically conductive material around the gate dielectric layer to form a gate electrode, wherein the gate electrode has a first width at a first location of the removed top layer of the second semiconductor material, wherein the gate electrode has a second width at a second location between the first plurality of nanostructures, wherein the first width is larger than the second width.

4. The method of claim 1, wherein forming the first plurality of nanostructures further comprises, after forming the first layer stack and before the selective removing:
    recessing end portions of the first semiconductor material to form recesses in the first semiconductor material; and
    forming inner spacers in the recesses.

5. The method of claim 1, wherein forming the first ferroelectric capacitor comprises:
    forming a bottom electrode over and electrically coupled to the first gate structure;
    forming a ferroelectric film over the bottom electrode; and
    forming a top electrode over the ferroelectric film.

6. The method of claim 1, further comprising:
    forming a second fin over the substrate;
    forming second source/drain regions in the second fin;
    forming a second plurality of nanostructures over the second fin between the second source/drain regions, wherein the first plurality of nanostructures has a first number of layers of the second semiconductor material, and the second plurality of nanostructures has a second number of layers of the second semiconductor material, wherein the first number is different from the second number;
    forming a second gate structure around the second plurality of nanostructures; and
    forming a second ferroelectric capacitor over and electrically coupled to the second gate structure.

7. The method of claim 6, wherein the first plurality of nanostructures is formed to have a first width, and the second plurality of nanostructures is formed to have a second width different from the first width.

8. The method of claim 6, wherein a first layer of the second semiconductor material in the first plurality of nanostructures has a first height, and a second layer of the second semiconductor material in the second plurality of nanostructures has a second height different from the first height, wherein the first height and the second height are measured along a direction perpendicular to a major upper surface of the substrate.

9. The method of claim 6, further comprising forming an isolation structure between the first gate structure and the second gate structure, wherein an upper surface of the isolation structure distal from the substrate is level with an upper surface of the first ferroelectric capacitor.

10. A method of forming a semiconductor device, the method comprising:
    forming a first fin and a second fin that protrude above a substrate, the first fin being parallel to the second fin;
    forming a first plurality of nanostructures over the first fin, the first plurality of nanostructures comprising a first number of layers of a first semiconductor material that are separate from each other;
    forming a second plurality of nanostructures over the second fin, the second plurality of nanostructures comprising a second number of layers of the first semiconductor material that are separate from each other, the second number being smaller than the first number, wherein forming the second plurality of nanostructures comprises:
    forming a layer stack over the second fin, the layer stack comprising alternating layers of the first semiconductor material and a second semiconductor material;
    removing a top layer of the first semiconductor material of the layer stack distal from the substrate; and
    after removing the top layer of the first semiconductor material, selectively removing the second semiconductor material, remaining layers of the first semiconductor material of the layer stack forming the second plurality of nanostructures;
    forming first source/drain regions on opposing ends of the first plurality of nanostructures;
    forming second source/drain regions on opposing ends of the second plurality of nanostructures;
    forming a first gate structure around the first plurality of nanostructures; and
    forming a second gate structure around the second plurality of nanostructures.

11. The method of claim 10, further comprising:
    forming a first ferroelectric capacitor over and electrically coupled to the first gate structure; and
    forming a second ferroelectric capacitor over and electrically coupled to the second gate structure.

12. The method of claim 11, further comprising forming an isolation structure between the first gate structure and the second gate structure.

13. The method of claim 10, wherein removing the top layer of the first semiconductor material comprises:
    forming a mask layer over the layer stack;
    recessing the mask layer to expose the top layer of the first semiconductor material of the layer stack; and
    removing the exposed top layer of the first semiconductor material.

14. A method of forming a semiconductor device, the method comprising:
    forming, in a first device region of the semiconductor device, first nanostructures over a first fin that protrudes above a substrate, wherein the first nanostructures comprise a first number of layers of a first semiconductor material;
    forming, in a second device region of the semiconductor device, second nanostructures over a second fin that protrudes above the substrate, wherein the second nanostructures comprise a second number of layers of the first semiconductor material different from the first number, wherein forming the second nanostructures comprises:
        forming a layer stack over the second fin, the layer stack comprising alternating layers of the first semiconductor material and a second semiconductor material;
        removing a top layer of the first semiconductor material of the layer stack distal from the substrate; and
        after removing the top layer of the first semiconductor material, selectively removing the second semiconductor material, wherein remaining layers of the first semiconductor material of the layer stack form the second nanostructures;
    forming first source/drain regions at opposing ends of the first nanostructures;
    forming second source/drain regions at opposing ends of the second nanostructures;
    forming a first gate structure around the first nanostructures; and
    forming a second gate structure around the second nanostructures.

15. The method claim 14, further comprising:
    forming a first ferroelectric capacitor over and electrically coupled to the first gate structure; and
    forming a second ferroelectric capacitor over and electrically coupled to the second gate structure.

16. The method of claim 14, wherein the first nanostructures and the first fin are formed to have a first width, wherein the second nanostructures and the second fin are formed to have a second width different from the first width.

17. The method of claim 16, wherein the first number of layers of the first semiconductor material in the first nanostructures have a first thickness, and the second number of layers of the first semiconductor material in the second nanostructures have a second thickness different from the first thickness, wherein the first thickness and the second thickness are measured along a direction perpendicular to a major upper surface of the substrate.

18. The method of claim 14, wherein an uppermost layer of the first semiconductor material of the first nanostructures extends further from the substrate than an uppermost layer of the first semiconductor material of the second nanostructures, wherein an upper surface of the first fin and an upper surface of the second fin are at a same vertical level from the substrate.

19. The method of claim 14, wherein removing the top layer of the first semiconductor material is performed using a selective etching process.

20. The method of claim 14, wherein an upper portion of the second gate structure distal from the substrate is formed to have a first width, wherein a middle portion of the second gate structure contacting an uppermost layer of the first semiconductor material of the second nanostructures is formed to have a second width, wherein a lower portion of the second gate structure contacting a lowermost layer of the first semiconductor material of the second nanostructures is formed to have a third width, wherein the first width is smaller than the second width, and the second width is larger than the third width.

* * * * *